(12) United States Patent
Xu et al.

(10) Patent No.: US 12,118,946 B2
(45) Date of Patent: Oct. 15, 2024

(54) SCAN CIRCUIT AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Guanghua Xu, Beijing (CN); Yang Yu, Beijing (CN); Taofeng Xie, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/004,899

(22) PCT Filed: Feb. 16, 2022

(86) PCT No.: PCT/CN2022/076448
§ 371 (c)(1),
(2) Date: Jan. 10, 2023

(87) PCT Pub. No.: WO2023/155063
PCT Pub. Date: Aug. 24, 2023

(65) Prior Publication Data
US 2024/0249686 A1    Jul. 25, 2024

(51) Int. Cl.
*G09G 3/3266* (2016.01)
*G09G 3/3233* (2016.01)
*H10K 59/121* (2023.01)

(52) U.S. Cl.
CPC ......... *G09G 3/3266* (2013.01); *G09G 3/3233* (2013.01); *H10K 59/1213* (2023.02); *G09G 2300/0408* (2013.01); *G09G 2300/0819* (2013.01); *G09G 2300/0842* (2013.01); *G09G 2300/0861* (2013.01); *G09G 2310/08* (2013.01);
(Continued)

(58) Field of Classification Search
CPC ............... G09G 3/3266; G09G 3/3233; G09G 2300/0408; G09G 2300/0819; G09G 2300/0842; G09G 2300/0861; G09G 2310/08; G09G 2320/045; G09G 2330/021; H10K 59/1213
See application file for complete search history.

(56) References Cited

U.S. PATENT DOCUMENTS

2020/0118497 A1* 4/2020 Yamashita ........... G09G 3/3266

* cited by examiner

*Primary Examiner* — Deeprose Subedi
(74) *Attorney, Agent, or Firm* — Intellectual Valley Law, P.C.

(57) ABSTRACT

A scan circuit is provided, including first, second and third control signal driving circuits; wherein, in a first region, the first control signal driving circuit includes L stages, L being an integer ≥1; in a second region, the second control signal driving circuit includes M1 stages and the third control signal driving circuit includes M2 stages, M1, M2 each being an integer ≥1; in a third region, the first control signal driving circuit includes N1 stages, the second control signal driving circuit includes N2 stages, and the third control signal driving circuit includes N3 stages, N1, N2, N3 each being an integer ≥2; and the first region, the second region, and the third region surround a first portion, a second portion, and a third portion of a perimeter of a display region, respectively, the first portion, the second portion, and the third portion being at least partially non-overlapping.

20 Claims, 22 Drawing Sheets

(52) U.S. Cl.
CPC . *G09G 2320/045* (2013.01); *G09G 2330/021* (2013.01)

SCAN CIRCUIT AND DISPLAY APPARATUS

CROSS-REFERENCE TO RELATED APPLICATION

This application is a national stage application under 35 U.S.C. § 371 of International Application No. PCT/CN2022/076448, filed Feb. 16, 2022, the contents of which are incorporated by reference in the entirety.

TECHNICAL FIELD

The present invention relates to display technology, more particularly, to a scan circuit and a display apparatus.

BACKGROUND

Image display apparatuses include a driver for controlling image display in each of a plurality of pixels. The driver is a transistor-based circuit including a control signal driving circuit and a data signal driving circuit. The control signal driving circuit is formed by cascading multiple units of shift register units. Each shift register unit outputs a control signal to one of a plurality of control signal lines. The control signals from the control signal driving circuit scan through control signal lines row by row. The control signal driving circuit can be integrated into a gate-driver-on-array (GOA) circuit, which can be formed directly in the array substrate of the display panel. Examples of control signal driving circuits include a gate scanning signal driving circuit, a light emission control signal driving circuit, and a reset control signal driving circuit.

SUMMARY

In one aspect, the present disclosure provides a scan circuit, A scan circuit, comprising a first control signal driving circuit, a second control signal driving circuit, and a third control signal driving circuit; wherein, in a first region, the first control signal driving circuit comprises L stages, L being an integer ≥1; in a second region, the second control signal driving circuit comprises M1 stages and the third control signal driving circuit comprises M2 stages, M1 being an integer ≥1, M2 being an integer ≥1; in a third region, the first control signal driving circuit comprises N1 stages, the second control signal driving circuit comprises N2 stages, and the third control signal driving circuit comprises N3 stages, N1 being an integer ≥2, N2 being an integer ≥2, N3 being an integer ≥2; and the first region, the second region, and the third region surround a first portion, a second portion, and a third portion of a perimeter of a display region, respectively, the first portion, the second portion, and the third portion being at least partially non-overlapping.

Optionally, the first portion, the second portion, and the third portion are completely non-overlapping.

Optionally, a stage of the M1 stages and a stage of the N2 stages are two consecutive stages of the second control signal driving circuit; a stage of the M2 stages and a stage of the N3 stages are two consecutive stages of the third control signal driving circuit; and a stage of L stages and a stage of N1 stages are two consecutive stages of the first control signal driving circuit.

Optionally, the N2 stages of the second control signal driving circuit, the N1 stages of the first control signal driving circuit, and the N3 stages of the third control signal driving circuit are arranged along a same direction; and the L stages of the first control signal driving circuit is displaced from the M1 stages of the second control signal driving circuit and the M2 stages of the third control signal driving circuit which are arranged along a same direction.

Optionally, the N2 stages of the second control signal driving circuit, the N1 stages of the first control signal driving circuit, and the N3 stages of the third control signal driving circuit are arranged in three rows in the third region, each row surrounding the third portion; the M1 stages of the second control signal driving circuit and the M2 stages of the third control signal driving circuit are arranged in two rows in the second region, each row surrounding the second portion; and the L stages of the first control signal driving circuit are arranged in one row surrounding the first portion.

Optionally, the scan circuit further comprises one or more signal lines connecting the L stages of the first control signal driving circuits in the first region and the N1 stages of the first control signal driving circuits in the third region; and at least one of the one or more signal lines surrounds the second portion, and extends through the second region.

Optionally, at least one of the one or more signal lines is between a first row of the M1 stages of the second control signal driving circuit and a second row of the M2 stages of the third control signal driving circuit.

Optionally, the one or more signal lines comprises an input signal line of a first stage of the N1 stages of the first control signal driving circuit, extending through the second region and connected to an output terminal of a last stage of the L stages of the first control signal driving circuit.

Optionally, the one or more signal lines comprise at least one signal line having a first segment and a second segment coupled to each other; the first segment at least partially extends in the first region; the second segment at least partially extends in the second region; the first segment is in a second conductive layer; and the second segment is in a first signal line layer different from the second conductive layer.

Optionally, the first segment in the first region is adjacent to L number of output signal lines configured to transmit output signals from the L stages of the first control signal driving circuit in the first region, respectively; the first segment and segments of the L number of output signal lines in the first region are between the L stages of the first control signal driving circuit and the display region; and the L number of output signal lines is in a third conductive layer different from the first signal line layer and the second conductive layer.

Optionally, the scan circuit further comprises L number of output signal lines connected to the L stages of the first control signal driving circuit in the first region, respectively; the L number of output signal lines extend from the first region into the second region by different length; and the L number of output signal lines are coupled to (j*L) number of rows of subpixels, respectively, j being an integer ≥1.

Optionally, in the second region, the M1 stages of the second control signal driving circuit are on a side of the M2 stages of the third control signal driving circuit away from the display region; and segments of the L number of output signal lines in the second region are on a side of the M2 stages of the third control signal driving circuit closer to the display region.

Optionally, the M1 stages and P1 null stages of the second control signal driving circuit are arranged in a first row and (M1+P1) columns in the second region, the first row surrounding the second portion; and the M2 stages and P2 null stages of the third control signal driving circuit are arranged in a second row and (M2+P2) columns in the second region, the second row surrounding the second portion.

Optionally, a p1-th null stage and an m1-th stage of the second control signal driving circuit have a same circuit structure; the p1-th null stage is disconnected from subpixels in the display region; the m1-th stage is electrically connected to one or more subpixels in the display region; a p2-th null stage and an m2-th stage of the third control signal driving circuit have a same circuit structure; the p2-th null stage is disconnected from subpixels in the display region; and the m2-th stage is electrically connected to one or more subpixels in the display region.

Optionally, in the third region, the N2 stages of the second control signal driving circuit, the N1 stages of the first control signal driving circuit, and the N3 stages of the third control signal driving circuit are sequentially arranged along the same direction from the third region toward the display region; and in the second region, the M1 stages of the second control signal driving circuit and the M2 stages of the third control signal driving circuit are sequentially arranged along a same direction from the second region toward the display region.

Optionally, in the third region, the N1 stages of the first control signal driving circuit, the N2 stages of the second control signal driving circuit, and the N3 stages of the third control signal driving circuit are sequentially arranged along the same direction from the third region toward the display region; and in the second region, the M1 stages of the second control signal driving circuit and the M2 stages of the third control signal driving circuit are sequentially arranged along a same direction from the second region toward the display region.

Optionally, in the third region, the N2 stages of the second control signal driving circuit, the N3 stages of the third control signal driving circuit, and the N1 stages of the first control signal driving circuit are sequentially arranged along the same direction from the third region toward the display region; and in the second region, the M1 stages of the second control signal driving circuit and the M2 stages of the third control signal driving circuit are sequentially arranged along a same direction from the second region toward the display region.

Optionally, the first control signal driving circuit, the second control signal driving circuit, and the third control signal driving circuit are three different control signal driving circuits selected from a first gate scanning signal driving circuit, a light emission control signal driving circuit, and a second gate scanning signal driving circuit.

In another aspect, the present disclosure provides a display apparatus, including the above scan circuit, and a display panel comprising a plurality of pixel driving circuits and a plurality of light emitting elements driven by the plurality of pixel driving circuits; wherein the scan circuit is configured to transmit control signals to the plurality of pixel driving circuits; the first control signal driving circuit is configured to transmit gate scanning signals to first N-type transistors in the plurality of pixel driving circuits and reset control signals to second N-type transistors in the plurality of pixel driving circuits; the second control signal driving circuit is configured to transmit light emission control signals to light emission control transistors in the plurality of pixel driving circuits; and the third control signal driving circuit is configured to transmit gate scanning signals to P-type transistors in the plurality of pixel driving circuits.

Optionally, at least the second region is at a corner of the display apparatus.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a scan circuit and a display apparatus that substantially obviate one or more of the problems due to limitations and disadvantages of the related art. In one aspect, the present disclosure provides a scan circuit. In some embodiments, the scan circuit includes a first control signal driving circuit, a second control signal driving circuit, and a third control signal driving circuit. Optionally, in a first region, the first control signal driving circuit comprises L stages, L being an integer ≥1. Optionally, in a second region, the second control signal driving circuit comprises M1 stages and the third control signal driving circuit comprises M2 stages, M1 being an integer ≥1, M2 being an integer ≥1. Optionally, in a third region, the first control signal driving circuit comprises N1 stages, the second control signal driving circuit comprises N2 stages, and the third control signal driving circuit comprises N3 stages, N1 being an integer ≥2, N2 being an integer ≥2, N3 being an integer ≥2. Optionally, the first region, the second region, and the third region surround a first portion, a second portion, and a third portion of a perimeter of a display region, the first portion, the second portion, and the third portion being at least partially non-overlapping.

Figure 1:
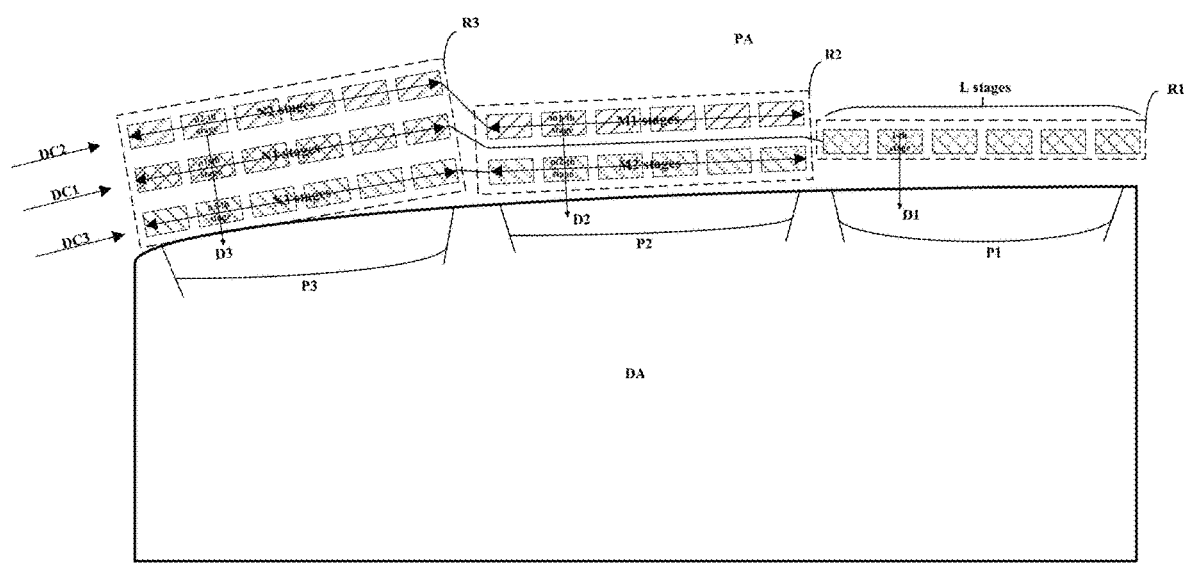
FIG. 1 is a schematic diagram illustrating a scan circuit in some embodiment according to the present disclosure.

FIG. 1 is a schematic diagram illustrating a scan circuit in some embodiment according to the present disclosure. Referring to FIG. 1, the scan circuit in some embodiment includes a first control signal driving circuit DC1, a second control signal driving circuit DC2, and a third control signal driving circuit DC3, for example, in a peripheral region PA of a display apparatus. The peripheral region PA in some embodiments includes a first region R1, a second region R2, and a third region R3.

In some embodiments, in the first region R1, the first control signal driving circuit DC1 includes L stages, L being an integer ≥1; in the second region R2, the second control signal driving circuit DC2 includes M1 stages and the third control signal driving circuit DC3 includes M2 stages, M1 being an integer ≥1, M2 being an integer ≥1; and in the third region R3, the first control signal driving circuit DC1 includes N1 stages, the second control signal driving circuit DC2 includes N2 stages, and the third control signal driving circuit DC3 includes N3 stages, N1 being an integer ≥2, N2 being an integer ≥2, N3 being an integer ≥2. In one example, L=M1=M2. In another example, M1=M2, L>M1, and L>M2. In another example, L≠M1≠M2. In another example N1=N2=N3. In another example, N1≠N2≠N3. In another example, N1=N2≠N3. In another example, N2=N3≠N1. In another example, N1=N3≠N2.

In some embodiments, N1=a*N0, N2=b*N0, and N3=c*N0, wherein a, b, c are positive integers ≥1, N0 is an integer ≥2. In one example, a=b=c=1. In another example, at least one of a, b, and c is different from the other two.

In some embodiments, M1=d*M0, and M2=e*M0, wherein d and e are positive integers ≥1, M0 is an integer ≥1. In one example, d=e=1. In another example, d is different from e.

In some embodiments, the first region R1, the second region R2, and the third region R3 surround a first portion P1, a second portion P2, and a third portion P3 of a perimeter of a display region DA. Optionally, the first portion P1, the second portion P2, and the third portion P3 are at least partially non-overlapping. Optionally, the first portion P1, the second portion P2, and the third portion P3 are completely non-overlapping. Optionally, at least two of the first portion P1, the second portion P2, and the third portion P3 are partially overlapping but not completely overlapping.

In some embodiments, a stage of the M1 stages and a stage of the N2 stages are two consecutive stages of the second control signal driving circuit; a stage of the M2 stages and a stage of the N3 stages are two consecutive stages of the third control signal driving circuit; and a stage of L stages and a stage of N1 stages are two consecutive stage s of the first control signal driving circuit. In one example, the M1 stages are stages previous to the N2 stages in the second control signal driving circuit, a last stage of the M1 stages and a first stage of the N2 stages are two consecutive stages of the second control signal driving circuit. In another example, the N2 stages are stages previous to the M1 stages in the second control signal driving circuit, a last stage of the N2 stages and a first stage of the M1 stages are two consecutive stages of the second control signal driving circuit. In another example, the M2 stages are stages previous to the N3 stages in the third control signal driving circuit, a last stage of the M2 stages and a first stage of the N3 stages are two consecutive stages of the third control signal driving circuit. In another example, the N3 stages are stages previous to the M2 stages in the third control signal driving circuit, a last stage of the N3 stages and a first stage of the M2 stages are two consecutive stages of the third control signal driving circuit. In another example, the L stages are stages previous to the N1 stages in the first control signal driving circuit, a last stage of the L stages and a first stage of the N1 stages are two consecutive stages of the first control signal driving circuit. In another example, the N1 stages are stages previous to the L stages in the first control signal driving circuit, a last stage of the N1 stages and a first stage of the L stages are two consecutive stages of the first control signal driving circuit.

Figure 2:
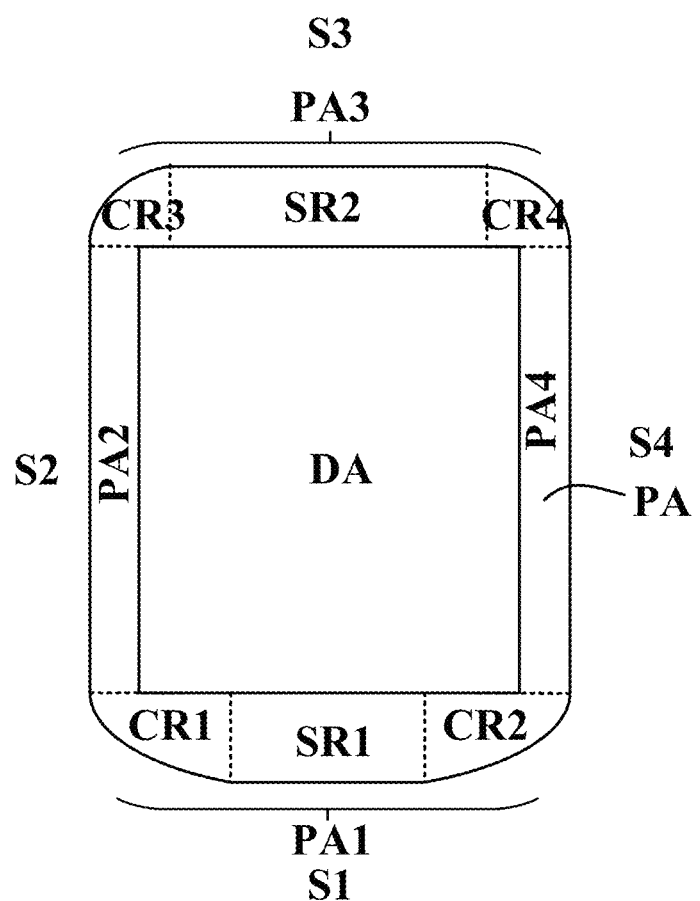
FIG. 2 is a schematic diagram illustrating a display region and a peripheral region in a display apparatus in some embodiments according to the present disclosure.

In some embodiments, at least the second region R2 is at a corner of a display apparatus. Optionally, the second region R2, at least a part of the first region R1, and at least a part of the third region R3 are in a same corner region of the display apparatus. In one example, the first region R1, the second region R2, and the third region R3 are in a same corner region of the display apparatus. FIG. 2 is a schematic diagram illustrating a display region and a peripheral region in a display apparatus in some embodiments according to the present disclosure. Referring to FIG. 2, in some embodiments, the display apparatus includes a display region DA and a peripheral region PA. In some embodiments, the peripheral region PA includes a first sub-area PA1 on a first side S1 of the display region DA, a second sub-area PA2 on a second side S2 of the display region DA, a third sub-area PA3 on a third side S3 of the display region DA, a fourth sub-area PA4 on a fourth side S4 of the display region DA. Optionally, the first side S1 and the third side S3 are opposite to each other. Optionally, the second side S2 and the fourth side S4 are opposite to each other. Optionally, the first sub-area PA1 is a sub-area where signal lines of the display apparatus are connected to an integrated circuit.

As used herein, the term "display region" refers to a region of a display apparatus where image is actually displayed. Optionally, the display region may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral region" refers to a region of a display apparatus where various circuits and wires are provided to transmit signals to an array substrate. To increase the transparency of a display apparatus, non-transparent or opaque components of the display apparatus (e.g., battery, printed circuit board, metal frame), can be disposed in the peripheral region rather than in the display region.

In some embodiments, the first sub-area PA1 includes a first side region SR1 and one or more corner regions (e.g., a first corner region CR1 and a second corner region CR2). The one or more corner regions are respectively at a corner of the display panel. The one or more corner regions respectively connect the first side region SR1 to one or more adjacent sub-areas of the peripheral region PA. For example, the first corner region CR1 connects the first side region SR1 to the second sub-area PA2, and the second corner region CR2 connects the first side region SR1 to the fourth sub-area PA4.

In some embodiments, the third sub-area PA3 includes a second side region SR2 and one or more corner regions (e.g., a third corner region CR3 and a fourth corner region CR4). The one or more corner regions are respectively at a corner of the display panel. The one or more corner regions respectively connect the second side region SR2 to one or more adjacent sub-areas of the peripheral region PA. For example, the third corner region CR3 connects the second side region SR2 to the second sub-area PA2, and the fourth corner region CR4 connects the second side region SR2 to the fourth sub-area PA4.

In one example, at least the second region R2 is in the first corner region CR1 of the display apparatus. In another example, at least the second region R2 is in the second corner region CR2 of the display apparatus. In another example, at least the second region R2 is in the third corner region CR3 of the display apparatus. In another example, at least the second region R2 is in the fourth corner region CR4 of the display apparatus. In another example, in at least two of the corner regions, the scan circuit is arranged in a manner according to the present disclosure.

The inventors of the present disclosure discover that in the corner region, particularly a round corner region, the space available for disposing the scan circuit is more limited as compared to a non-corner region such as the second sub-area PA2 and the fourth sub-area PA4. In order to have sufficient space to dispose a scan circuit having multiple control signal driving circuits, typically one will have to expand the corner region, or decrease the display region of the display panel. Moreover, having multiple control signal driving circuits in a limited space unavoidably makes the fabrication process more difficult, often resulting in line break or short. The inventors of the present disclosure discover that the scan circuit having the intricate structure disclosed herein obviates these issues, leading to an increased display region, a narrower bezel, and a simpler fabrication process.

Referring to FIG. 1 again, in some embodiments, the N2 stages of the second control signal driving circuit, the N1 stages of the first control signal driving circuit, and the N3 stages of the third control signal driving circuit are arranged along a same direction (e.g., a third direction D3). In one example, when N1=N2=N3=N, n-th stages of the second control signal driving circuit DC2, the first control signal driving circuit DC1, and the third control signal driving circuit DC3 are arranged along a same direction (e.g., a third direction D3), $1 \leq n \leq N$, n being an integer. In some embodiments, the M1 stages of the second control signal driving circuit and the M2 stages of the third control signal driving circuit are arranged along a same direction (e.g., a second direction D2). In one example, when M1=M2=M, m-th stages of the second control signal driving circuit DC2 and the third control signal driving circuit DC3 are arranged along a same direction (e.g., a second direction D2), $1 \leq m \leq M$, m being an integer. In some embodiments, a 1-th stage of the first control signal driving circuit DC1 and the first portion P1 are arranged along a first direction D1.

The arrangement of three control signal driving circuits in the third region R3 differs from the arrangement of three control signal driving circuits in the second region R2 in that, in the third region R3, the N2 stages of the second control signal driving circuit DC2, the N1 stages of the first control signal driving circuit DC1, and the N3 stages of the third control signal driving circuit DC3 are arranged along a same direction, whereas in the second region R2, the L stages of the first control signal driving circuit DC1 is displaced from the M1 stages of the second control signal driving circuit DC2 and the M2 stages of the third control signal driving circuit DC3 which are arranged along a same direction. The L stages of the first control signal driving circuit DC1 are displaced from the second region R2 to the first region R1. As a result, the L stages of the first control signal driving circuit DC1 is not at a position between the M1 stages of the second control signal driving circuit DC2 and the M2 stages of the third control signal driving circuit DC3.

In one example, when M1=M2=L=M, an m-th stage of the first control signal driving circuit DC1 is displaced from a direction along which an m-th stage of the second control signal driving circuit DC2 and an m-th stage of the third control signal driving circuit DC3 are arranged. The m-th stage of the first control signal driving circuit DC1 is displaced from the second region R2 to the first region R1, $1 \leq m \leq M$, m being an integer. As a result, the m-th stage of the first control signal driving circuit DC1 is not at a position between the m-th stage of the second control signal driving circuit DC2 and the m-th stage of the third control signal driving circuit DC3.

In some embodiments, the N2 stages of the second control signal driving circuit, the N1 stages of the first control signal driving circuit, and the N3 stages of the third control signal driving circuit are arranged in three rows, in the third region R3, each row surrounding the third portion P3. The M1 stages of the second control signal driving circuit and the M2 stages of the third control signal driving circuit are arranged in two rows in the second region R2, each row surrounding the second portion P2. L stages of the first control signal driving circuit are arranged in the first region R1 in one row surrounding the first portion P1.

In one example, when N1=N2=N3=N, N stages of three respective control signal driving circuits are arranged in three rows and N columns in the third region R3, each row surrounding the third portion P3, an n-th column comprising n-th stages of the three respective control signal driving circuits, 1≤n≤N, n being an integer.

In one example, when M1=M2=L=M, M stages of two (e.g., DC2 and DC3) of the three respective control signal driving circuits are arranged in two rows and M columns in the second region R2, each row surrounding the second portion P2, an m-th column comprising m-th stages of the two of the three respective control signal driving circuits and being absent of an m-th stage of another (e.g., DC1) of the three respective control signal driving circuits, 1 K m K M, m being an integer. M stages of the another (e.g., DC1) of the three respective control signal driving circuits are arranged in one row surrounding the first portion P1.

FIG. 1 illustrates an example in which the scan circuit includes three control signal driving circuits. The scan circuit may include one or more additional control signal driving circuits. In some embodiments, the scan circuit includes k number of control signal driving circuits, k being an integer ≥3. The k number of control signal driving circuits include the first control signal driving circuit DC1, the second control signal driving circuit DC2, and the third control signal driving circuit DC3. In some embodiments, the k number of control signal driving circuits are arranged in k rows in the third region R3, each row surrounding the third portion P3; h number of control signal driving circuits are arranged in h rows in the second region, each row surrounding the second portion P2; i number of control signal driving circuits are arranged in i rows in the first region R1, each row surrounding the first portion P1; 1≤h≤k; 1≤i≤k; h, and i being integers. Optionally, k=(h+i).

In one example, when the control signal driving circuits have a same number of stages, N stages of the k number of control signal driving circuits are arranged in k rows and N columns in the third region R3, each row surrounding the third portion P3, an n-th column comprising n-th stages of the k number of respective control signal driving circuits, 1≤n≤N; M stages of h number of control signal driving circuits are arranged in h rows and M columns in the second region R2, each row surrounding the second portion P2, an m-th column comprising m-th stages of the h number of control signal driving circuits and being absent of an m-th stage of i number of control signal driving circuits, 1≤m≤M, 1≤h≤k; 1≤i≤k; m, h, and i being integers; and M stages of the i number of control signal driving circuits are arranged in i rows and M columns in the first region R1, each row surrounding the first portion P1. Optionally, k=(h+i). Optionally, h>i. Optionally, i>h.

In some embodiments, the scan circuit includes k number of control signal driving circuits, k being an integer ≥3. M stages of i number of control signal driving circuits are in a first region, i being an integer, 1≤i<k. M stages of h number of control signal driving circuits are in a second region, h being an integer, 1≤h<k. N stages of the k number of control signal driving circuits are in a third region. In the first region, a respective one of the i number of control signal driving circuits comprises M stages, M being an integer ≥1. In the second region, a respective one of the h number of control signal driving circuits comprises M stages, M being an integer ≥1. In the third region, a respective one of the k number of control signal driving circuits comprises N stages, N being an integer ≥2. The first region, the second region, and the third region surround a first portion, a second portion, and a third portion of a perimeter of a display region, the first portion, the second portion, and the third portion being at least partially non-overlapping. Optionally, k=(h+i). Optionally, h>i. Optionally, i>h.

Figure 3:
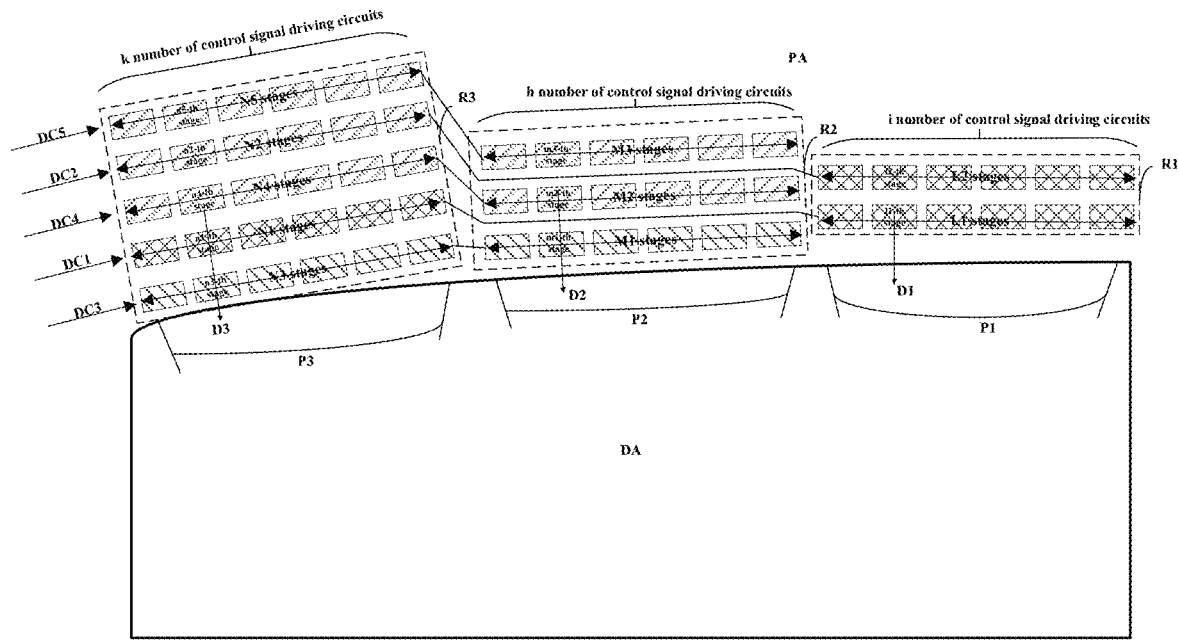
FIG. 3 is a schematic diagram illustrating a scan circuit in some embodiment according to the present disclosure.

FIG. 3 is a schematic diagram illustrating a scan circuit in some embodiment according to the present disclosure. FIG. 3 shows an example in which k=5, h=3, and i=2. In the example illustrated in FIG. 3, i is greater than 1; and h>i. In FIG. 3, the first region R1, the second region R2, and the third region R3 are sequentially arranged. The first portion P1, the second portion P2, and the third portion P3 are sequentially arranged.

Figure 4:
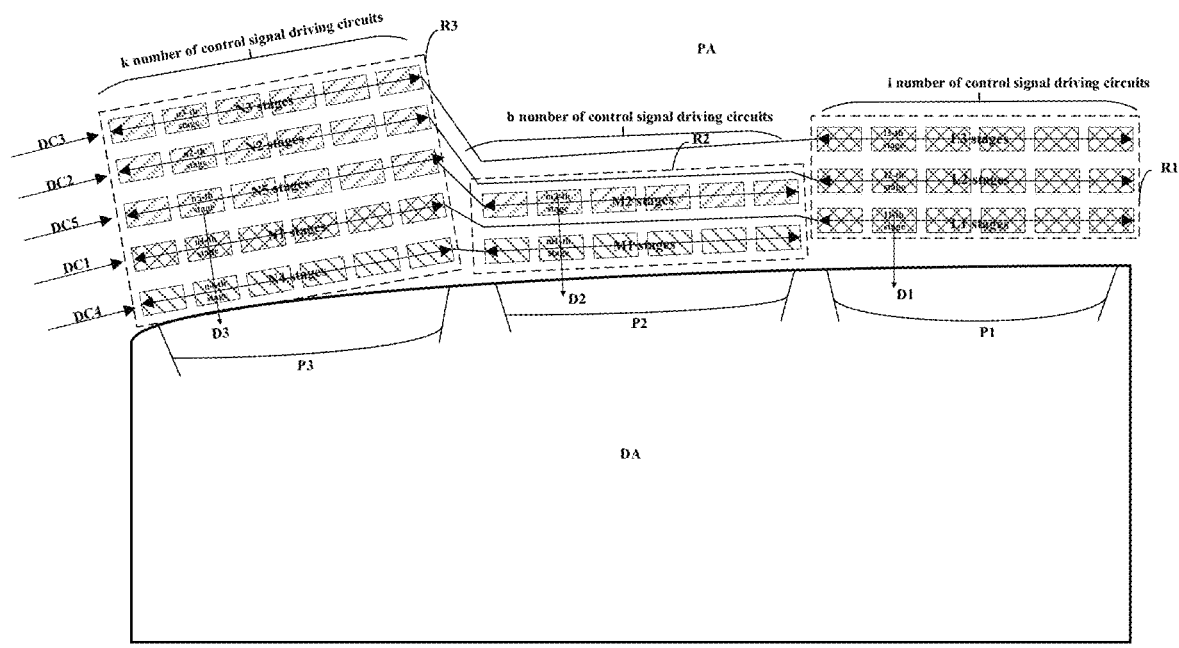
FIG. 4 is a schematic diagram illustrating a scan circuit in some embodiment according to the present disclosure.

FIG. 4 is a schematic diagram illustrating a scan circuit in some embodiment according to the present disclosure. FIG. 4 shows an example in which k=5, h=2, and i=3. In the example illustrated in FIG. 4, h<i. In FIG. 4, the first region R1, the second region R2, and the third region R3 are sequentially arranged. The first portion P1, the second portion P2, and the third portion P3 are sequentially arranged.

Figure 5:
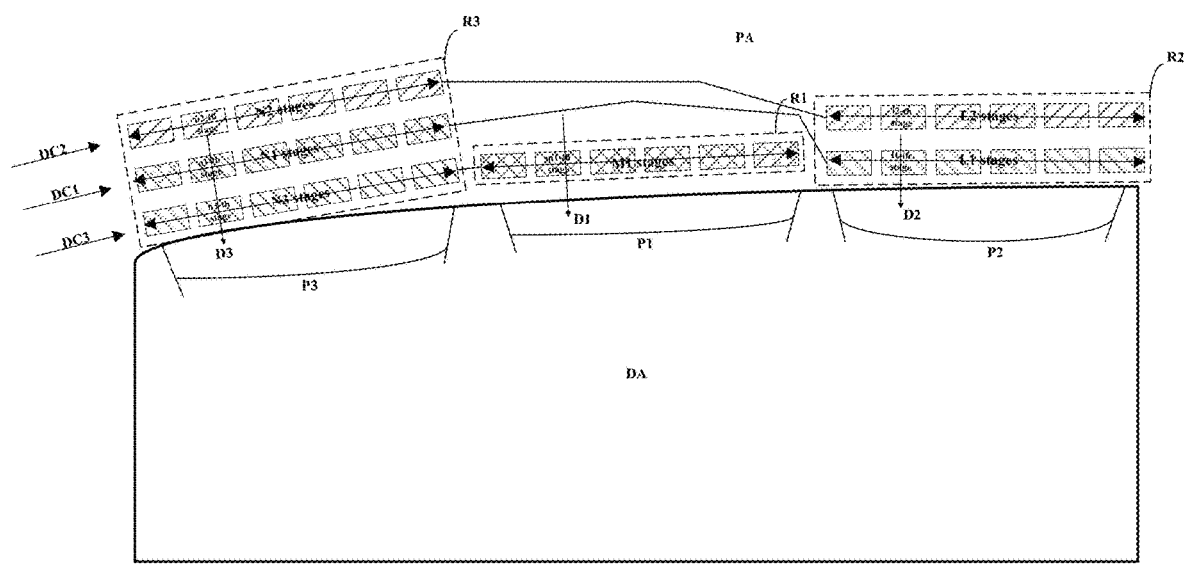
FIG. 5 is a schematic diagram illustrating a scan circuit in some embodiment according to the present disclosure.

FIG. 5 is a schematic diagram illustrating a scan circuit in some embodiment according to the present disclosure. FIG. 5 shows an example in which k=3, h=1, and i=2. In the example illustrated in FIG. 5, i is greater than 1; and i>h. In FIG. 5, the second region R2, the first region R1, and the third region R3 are sequentially arranged. The second portion P2, the first portion P1, and the third portion P3 are sequentially arranged.

Figure 6:
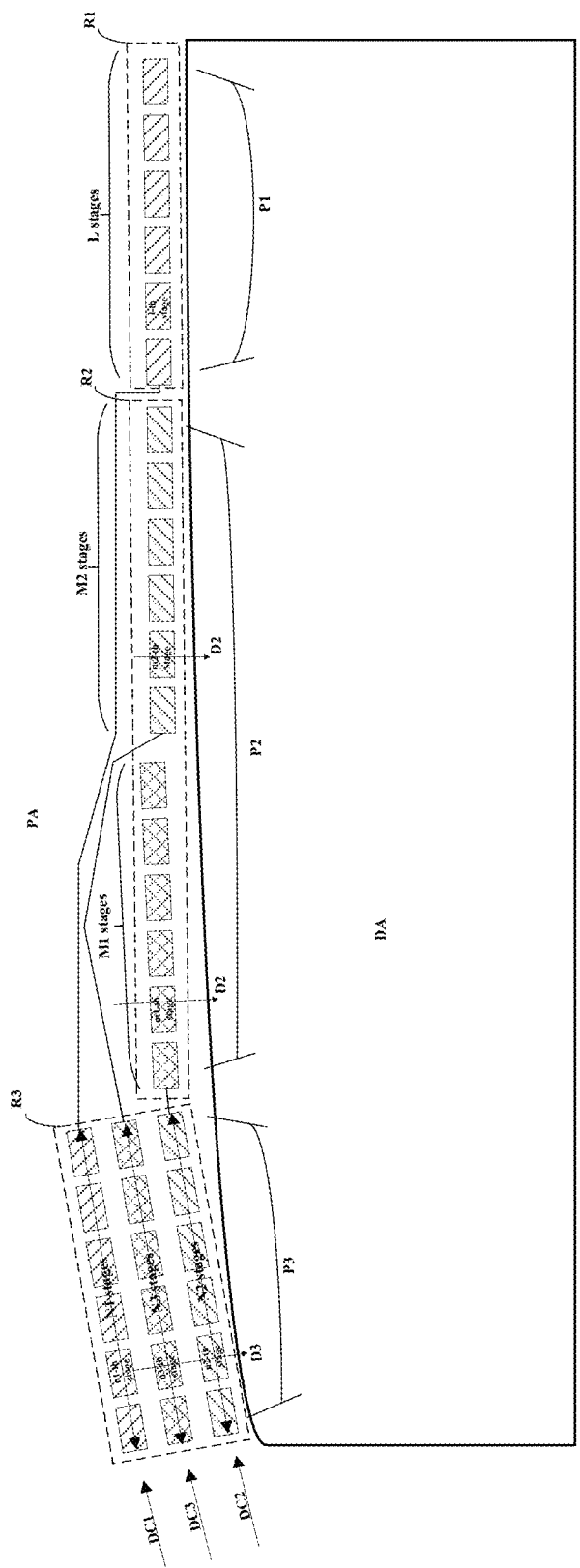
FIG. 6 is a schematic diagram illustrating a scan circuit in some embodiment according to the present disclosure.

FIG. 6 is a schematic diagram illustrating a scan circuit in some embodiment according to the present disclosure. FIG. 6 shows an example in which the peripheral region includes a first region R1, a second region R2, and a third region R3. In the first region, the first control signal driving circuit comprises L stages, L being an integer ≥1. In the second region R2, the second control signal driving circuit comprises M1 stages, and the third control signal driving circuit comprises M2 stages. In the third region R3, the first control signal driving circuit comprises N1 stages, the second control signal driving circuit comprises N2 stages, and the third control signal driving circuit comprises N3 stages, N1 being an integer ≥2, N2 being an integer ≥2, N3 being an integer ≥2. The first region R1, the second region R2, and the third region R3, surround a first portion P1, a second portion P2, and a third portion P3 of a perimeter of a display region DA. The first portion P1, the second portion P2, and the third portion P3 are at least partially non-overlapping. In one example, the first portion P1, the second portion P2, and the third portion P3 are completely non-overlapping. In another example, at least two of the first portion P1, the second portion P2, and the third portion P3 are partially but not completely non-overlapping. The scan circuit shown in FIG. 6 differs from the scan circuit shown in FIG. 1 in that the second region R2 in FIG. 6 includes (M1+M2) number of columns and only one row, whereas the second region R2 in FIG. 1 includes two rows, the first row having M1 columns and the second row having M2 columns.

Referring to FIG. 1, and FIG. 3 to FIG. 6, in some embodiments, the k number of control signal driving circuits are arranged along a same direction; and the i number of control signal driving circuits are displaced from a direction along which the h number of control signal driving circuits are arranged.

In one example, the control signal driving circuits have a same number of stages in each region, for example, each of the k number of control signal driving circuits in the third region R3 has N stages, each of the h number of control signal driving circuits in the second region R2 has M stages, and each of the i number of control signal driving circuits in the first region R1 has M stages. Optionally, n-th stages of the k number of control signal driving circuits are arranged along a same direction, $1 \leq n \leq N$; and m-th stages of the i number of control signal driving circuits are displaced from a direction along which the h number of control signal driving circuits are arranged, $1 \leq m \leq M$.

Figure 7A:
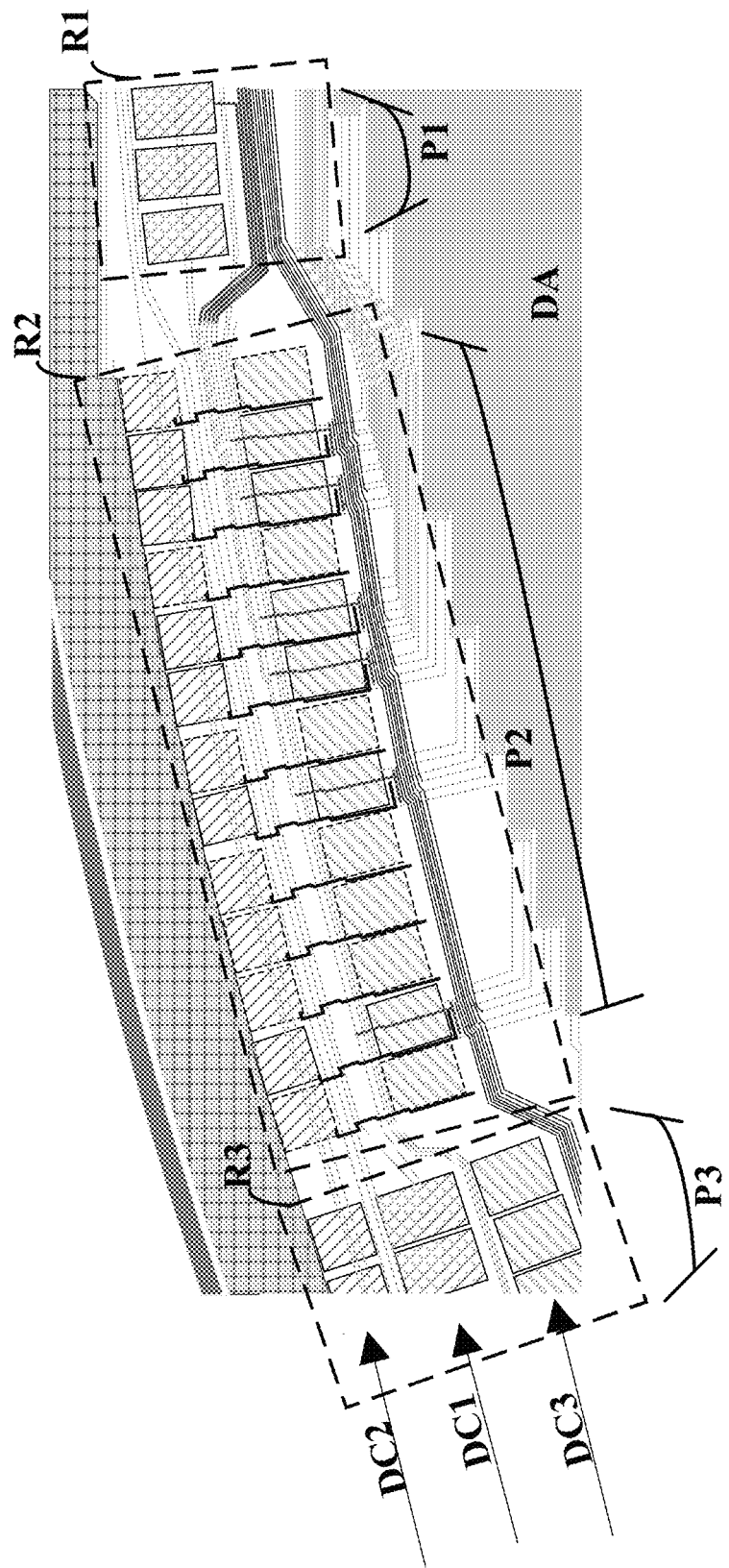
FIG. 7A is a schematic diagram illustrating a scan circuit in some embodiment according to the present disclosure.
Figure 7B:
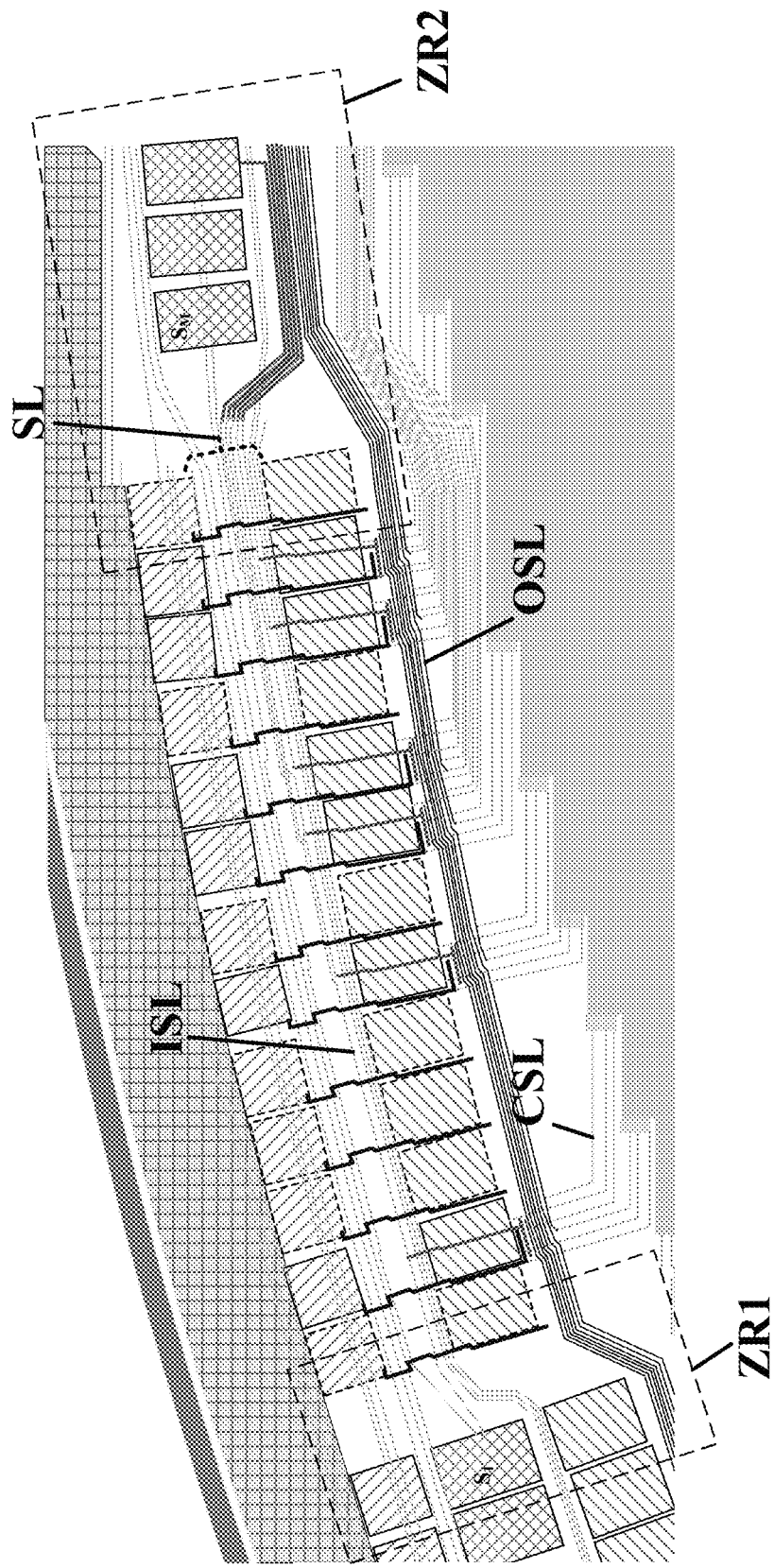
FIG. 7B is a schematic diagram illustrating a scan circuit in some embodiment according to the present disclosure.

FIG. 7A is a schematic diagram illustrating a scan circuit in some embodiment according to the present disclosure. FIG. 7B is a schematic diagram illustrating a scan circuit in some embodiment according to the present disclosure. The arrangement of stages of control signal driving circuits in the first region, the second region, and the third region are annotated in FIG. 7A. Referring to FIG. 7A and FIG. 7B, the scan circuit in some embodiments further includes one or more signal lines SL connecting L stages of the another (e.g., DC1) of the three respective control signal driving circuits in the first region R1 and N1 stages of the another (e.g., DC1) of the three respective control signal driving circuits in the third region R3.

Figure 7C:
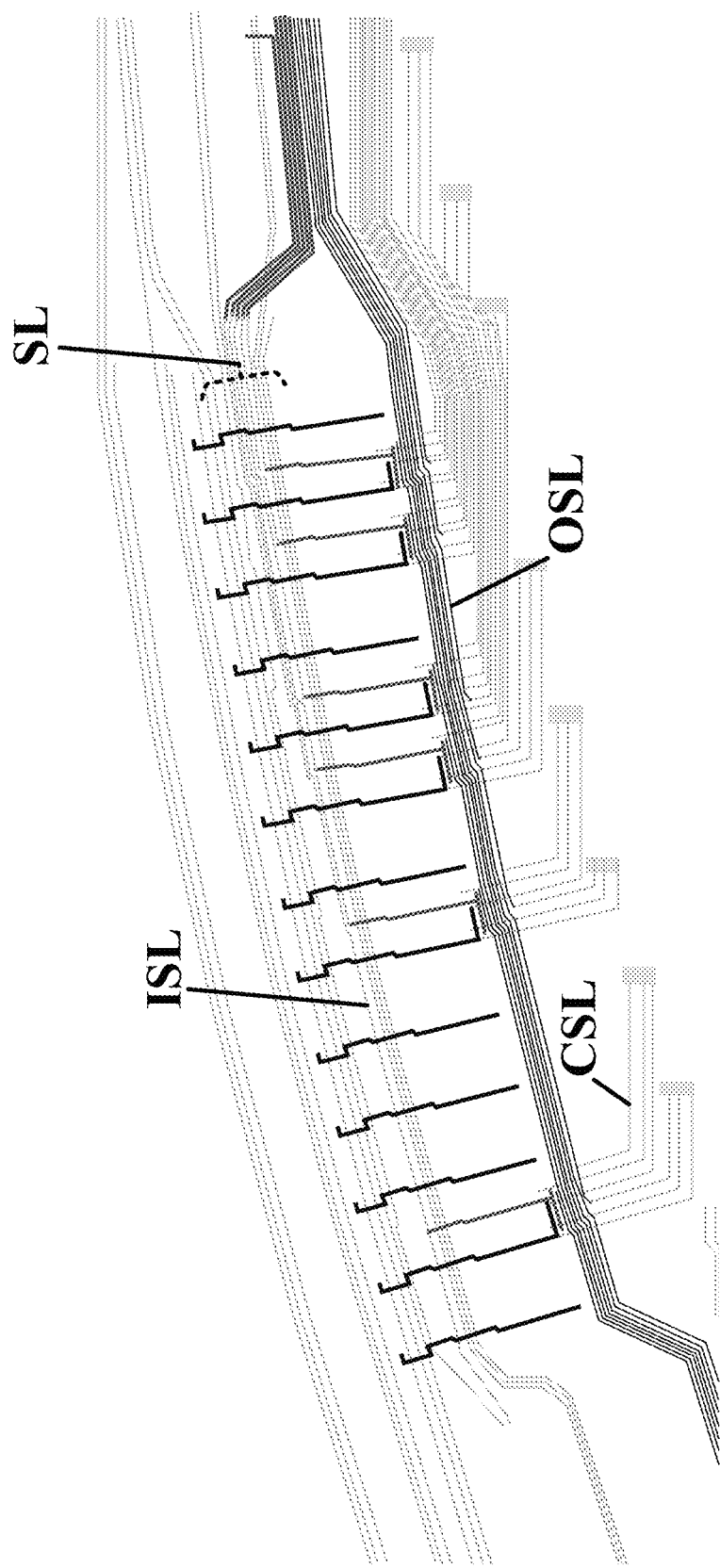
FIG. 7C illustrates signal lines of the scan circuit depicted in FIG. 7A and FIG. 7B.

FIG. 7C illustrates signal lines of the scan circuit depicted in FIG. 7A and FIG. 7B. Referring to FIG. 7A to FIG. 7C, at least one of the one or more signal lines SL surrounds the second portion P2, and extends through the second region R2. For example, the one or more signal lines SL includes an input signal line ISL of a first stage $S_1$ of the N1 stages of a respective control signal driving circuit (e.g., DC1), extending through the second region R2 and connected to an output terminal of a last stage of the L stages of the respective control signal driving circuit (e.g., DC1). An output signal from the last stage $S_L$ of the L stages of the respective control signal driving circuit is used as an input signal for the first stage $S_1$ of the N1 stages of a respective control signal driving circuit.

Other examples of the one or more signal lines SL include a first clock signal line configured to provide a first clock signal, a second clock signal line configured to provide a second clock signal, a first power supply signal line configured to provide a first power supply signal, and a second power supply signal line configured to provide a second power supply signal.

In some embodiments, at least one of the one or more signal lines is between two rows of M stages of two of the three respective control signal driving circuits. In one example, the at least one of the one or more signal lines is between a first row of the M1 stages of the second control signal driving circuit DC2 and a second row of the M2 stages of the third control signal driving circuit DC3 in the second region R2.

Figure 8A:
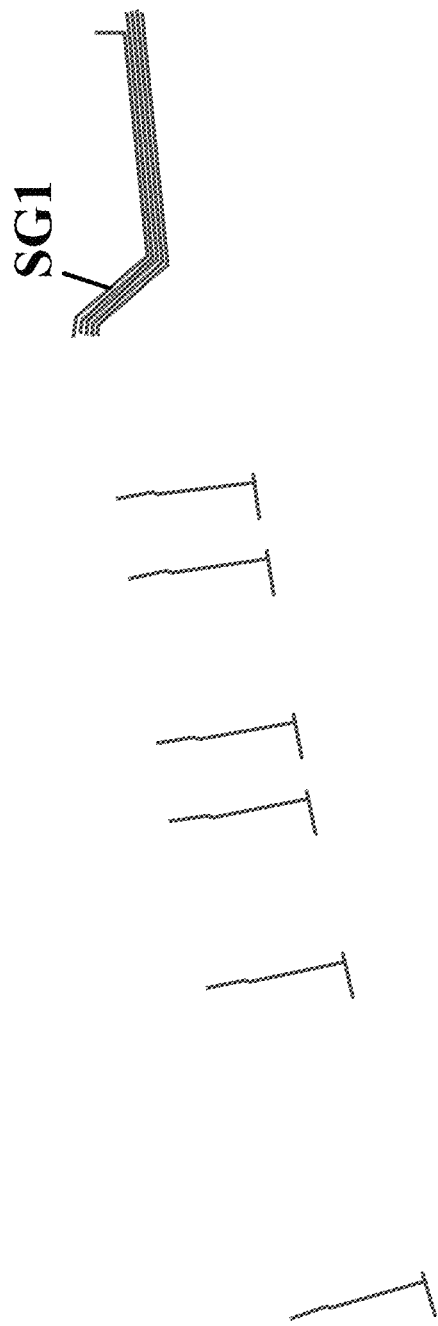
FIG. 8A illustrate the structure of a second conductive layer in FIG. 7C.
Figure 8B:
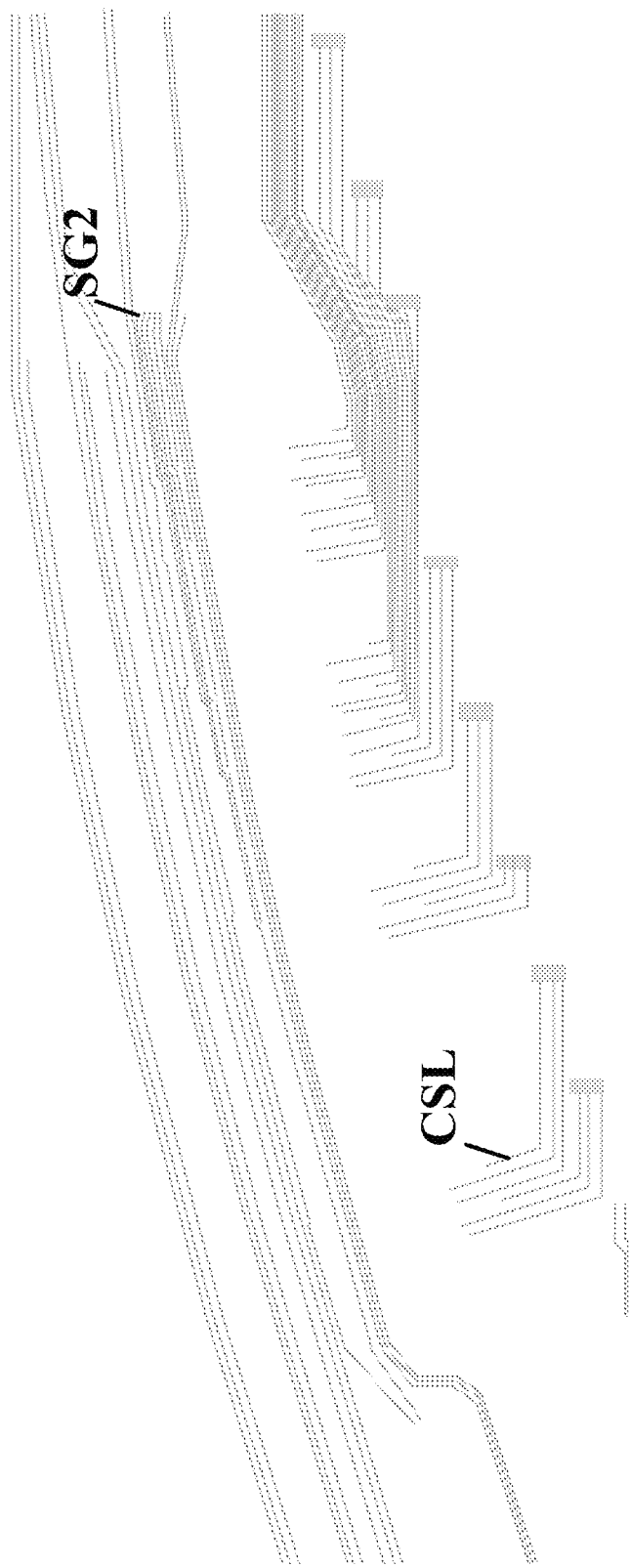
FIG. 8B illustrate the structure of a first signal line layer in FIG. 7C.
Figure 8C:
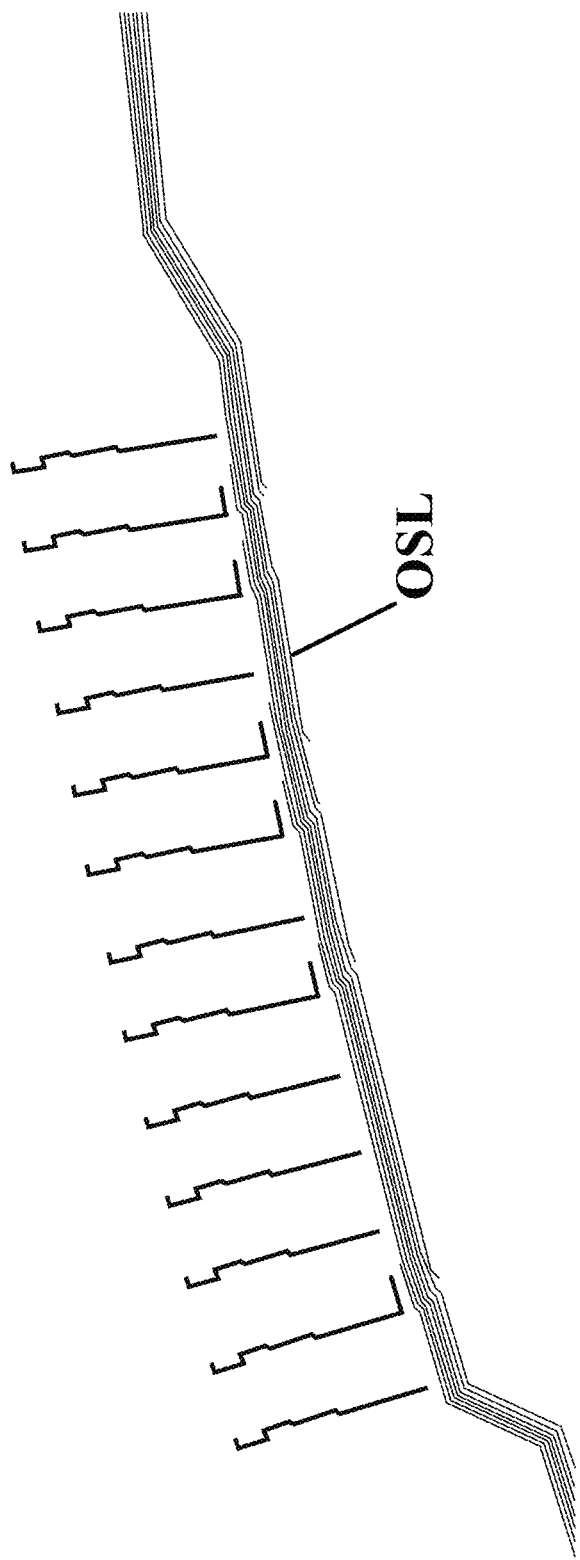
FIG. 8C illustrate the structure of a third conductive layer in FIG. 7C.
Figure 9A:
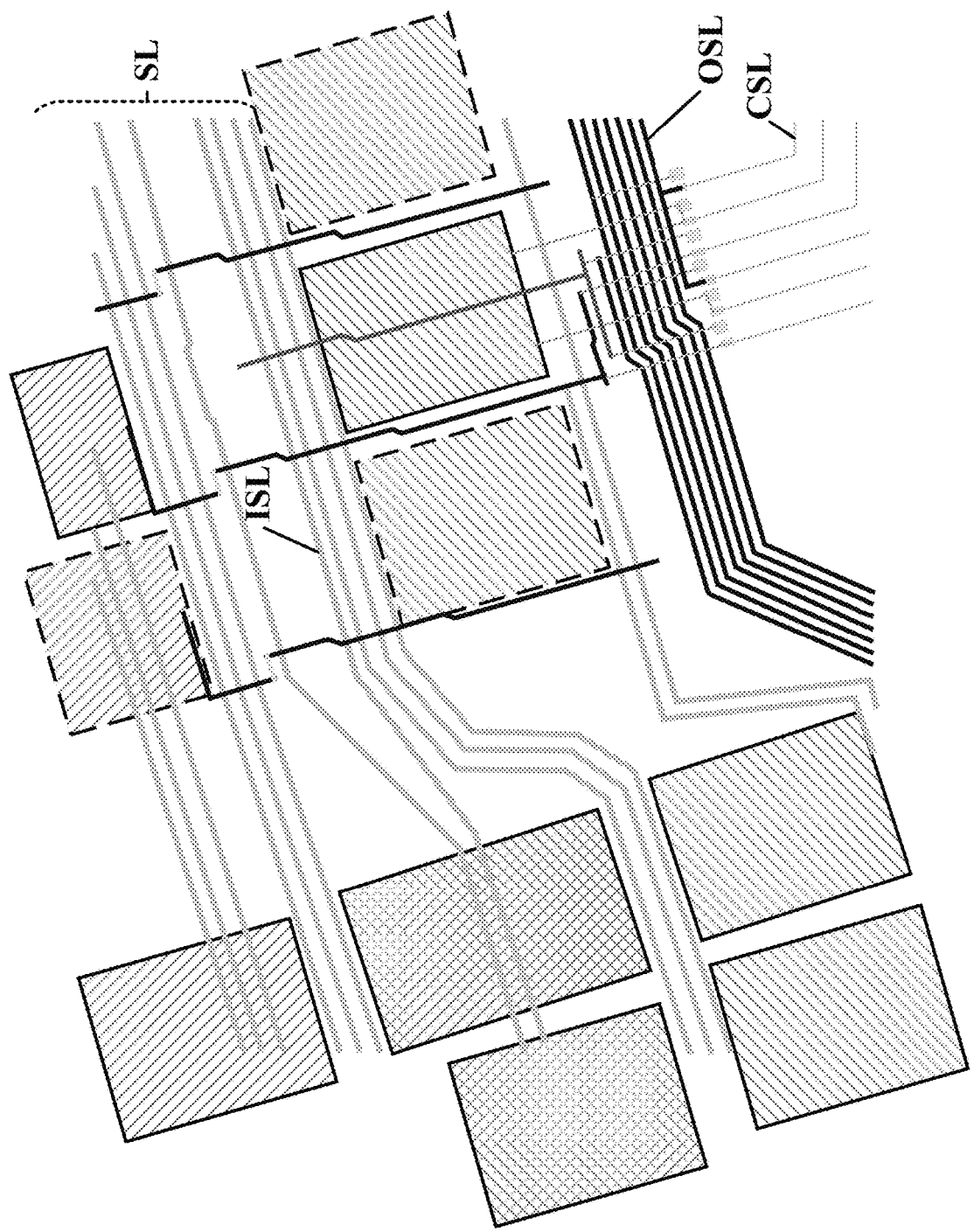
FIG. 9A is a zoom-in view of a first zoom-in region Z in FIG. 7B.
Figure 9B:
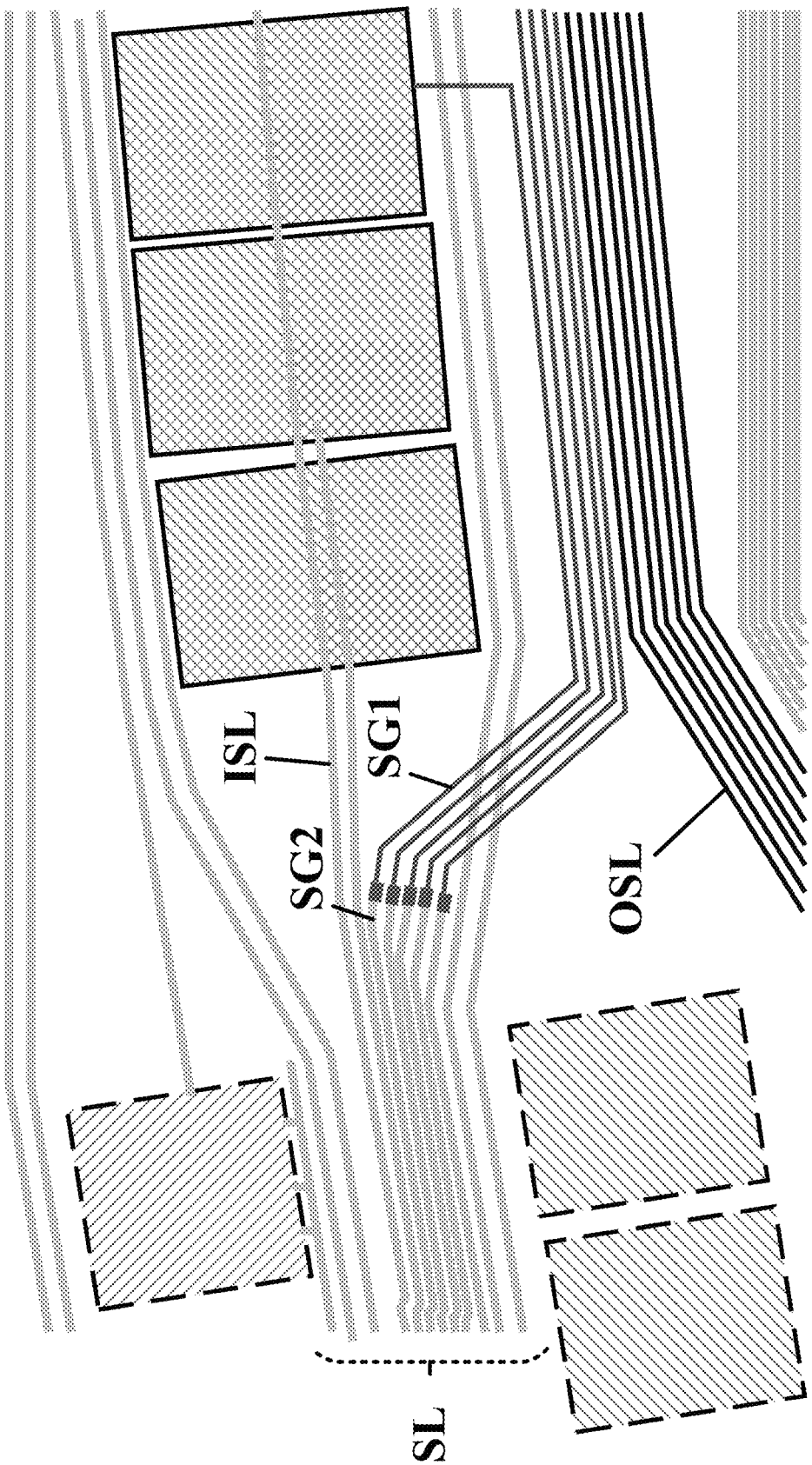
FIG. 9B is a zoom-in view of a second zoom-in region ZR2 in FIG. 7B.

FIG. 8A illustrate the structure of a second conductive layer in FIG. 7C. FIG. 8B illustrate the structure of a first signal line layer in FIG. 7C. FIG. 8C illustrate the structure of a third conductive layer in FIG. 7C. FIG. 9A is a zoom-in view of a first zoom-in region ZR1 in FIG. 7B. FIG. 9B is a zoom-in view of a second zoom-in region ZR2 in FIG. 7B. Referring to FIG. 7C, FIG. 8A to FIG. 8C, FIG. 9A, and FIG. 9B, the one or more signal lines SL in some embodiments include at least one signal line having a first segment SG1 and a second segment SG2 coupled to each other. The first segment SG1 at least partially extends in the first region R1. The second segment SG2 at least partially extends in the second region R2. Optionally, the first segment SG1 is in a second conductive layer. Optionally, the second segment SG2 is in a first signal line layer different from the second conductive layer.

In one example, the one or more signal lines SL are one or more gate scanning signal lines configured to transmit gate scanning signals to pixel driving circuits in the subpixels. In another example, the first control signal driving circuit DC1 is configured to transmit signals to N-type transistors in the pixel driving circuits (e.g., the second transistor T2 in FIG. 16). In another example, the one or more signal lines SL are one or more gate scanning signal lines configured to transmit gate scanning signals to N-type transistors in the pixel driving circuits in the subpixels.

FIG. 8A to FIG. 8C illustrate an example in which the first segment SG1 is in the second conductive layer and the second segment SG2 is in the first signal line layer. Various alternative implementations of the layer structure may be practiced in the present disclosure. For example, the first segment SG1 may be disposed in a first conductive layer, a third conductive layer, the first signal line layer, the second signal line layer, or any combination thereof, and the second segment SG2 may be disposed in the second signal line layer, the third signal line layer, or a combination of the first signal line layer and the second signal line layer.

In some embodiments, the scan circuit further includes L number of output signal lines OSL connected to the L stages of the first control signal driving circuit DC1 in the first region R1, respectively. Optionally, the L number of output signal lines OSL extend from the first region R1 into the second region R2 by different length. Optionally, the L number of output signal lines are coupled to (j*L) number of rows of subpixels, respectively, j being an integer $\geq 1$. FIG. 7A shows an example in which each output signal line is coupled to two rows of subpixels.

In one example, the L number of output signal lines OSL are configured to transmit reset control signals to pixel driving circuits in the subpixels. FIG. 7A shows an example in which each output signal line is coupled to two rows of pixel driving circuits. In another example, the first control signal driving circuit DC1 is configured to transmit signals to N-type transistors in the pixel driving circuits (e.g., the first transistor T1 in FIG. 16). In another example, the L number of output signal lines OSL are configured to transmit reset control signals to N-type transistors in the pixel driving circuits in the subpixels.

In some embodiments, the scan circuit further includes (j*L) number of control signal lines CSL. The L number of output signal lines OSL are coupled to the (j*L) number of rows of subpixels through the (j*L) number of control signal lines CSL. Optionally, the (j*L) number of control signal lines CSL are in the first signal line layer, and the L number of output signal lines OSL are in a third conductive layer.

Referring to FIG. 7A to FIG. 7C, FIG. 8A to FIG. 8C, FIG. 9A, and FIG. 9B, the first segment SG1 in the first region R1 is adjacent to the L number of output signal lines OSL configured to transmit output signals from the L stages of the first control signal driving circuit DC1 in the first region R1, respectively. Optionally, the first segment SG1 and segments of the L number of output signal lines OSL in the first region R1 are between the L stages of the first control signal driving circuit DC1 and the display region DA. Optionally, the L number of output signal lines OSL are in a third conductive layer, the first segment SG1 is in a second conductive layer, and the second segment SG2 is in a first signal line layer. The second conductive layer, the first signal line layer, and the third conductive layer are different layers.

FIG. 8A to FIG. 8C illustrate an example in which the L number of output signal lines OSL are in a third conductive layer. Various alternative implementations of the layer structure may be practiced in the present disclosure. For example, the L number of output signal lines OSL may be disposed in a first conductive layer, a second conductive layer, the first signal line layer, the second signal line layer, the third signal line layer, or any combination thereof.

In some embodiments, in the second region R2, the M1 stages of the second control signal driving circuit DC2 are on a side of the M2 stages of the third control signal driving circuit DC3 away from the display region DA. Optionally, segments of the L number of output signal lines OSL in the second region R2 are on a side of the M2 stages of the third control signal driving circuit DC3 closer to the display region DA.

Figure 10:
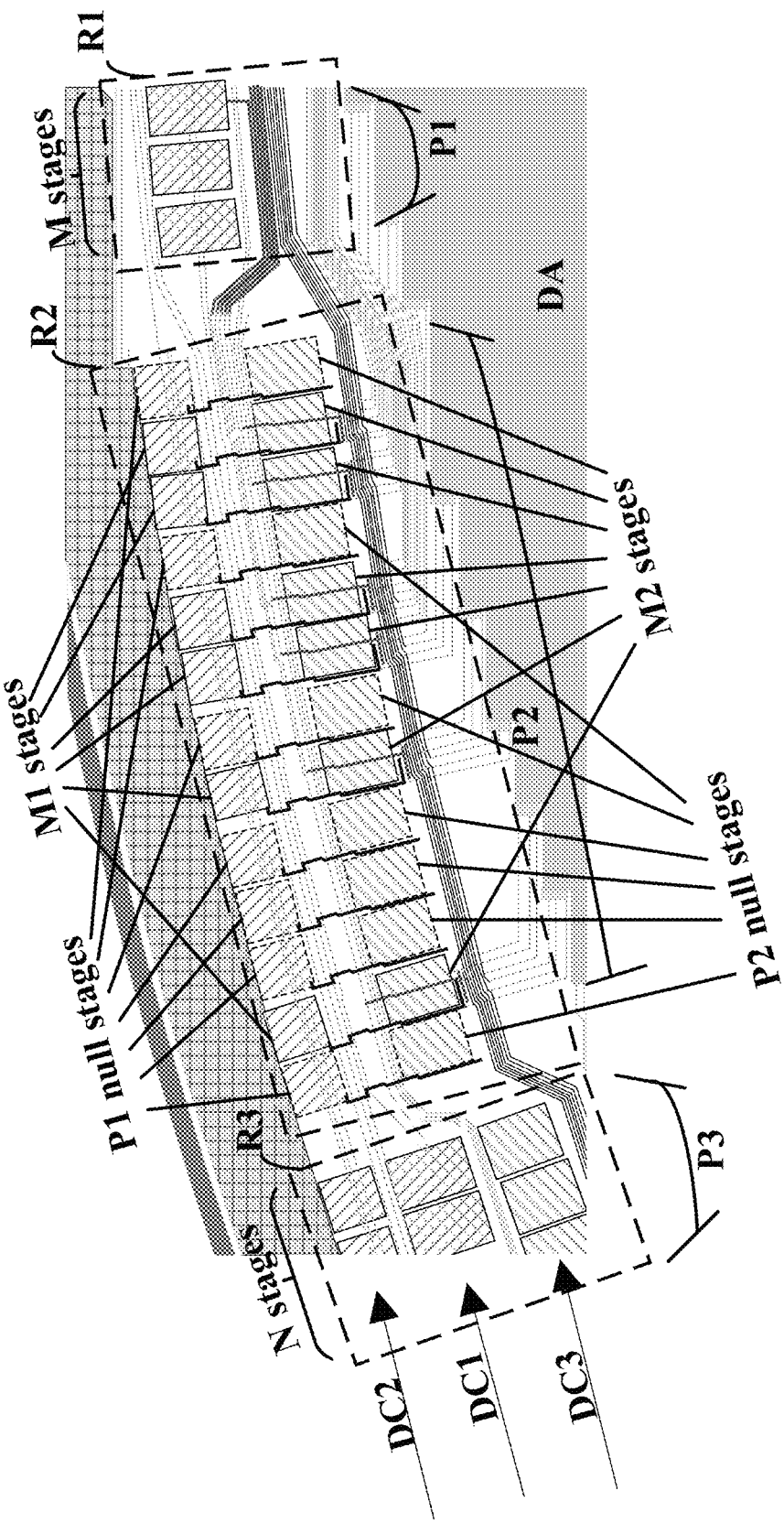
FIG. 10 is a schematic diagram illustrating a scan circuit in some embodiment according to the present disclosure.

In some embodiments, the control signal driving circuits in the second region R2 include null stages. FIG. 10 is a schematic diagram illustrating a scan circuit in some embodiment according to the present disclosure. Referring to FIG. 10, in some embodiments, functional stages and null stages of two respective control signal driving circuits (e.g., DC2 and DC3) are arranged in two rows in the second region R2, each row surrounding the second portion P2. Specifically, M1 stages and P1 null stages of the second control signal driving circuit DC2 are arranged in a first row and (M1+P1) columns in the second region R2, the first row surrounding the second portion P2. M2 stages and P2 null stages of the third control signal driving circuit DC3 are arranged in a second row and (M2+P2) columns in the second region R2, the second row surrounding the second portion P2. The null stages are included for enhancing uniformity during the fabrication process. For example, by having the null stages, etching uniformity can be greatly improved.

In one example, M1=M2=M, P1=P2=P, an m-th column comprising m-th stages of the two (e.g., DC2 and DC3) of the three respective control signal driving circuits and being absent of an m-th stage of another (e.g., DC1) of the three respective control signal driving circuits, 1≤m≤M. Optionally, a p-th column comprising p-th null stages of the two (e.g., DC2 and DC3) of the three respective control signal driving circuits and being absent of a p-th null stage of the another (e.g., DC1) of the three respective control signal driving circuits, 1≤(m+p)≤(M+P).

In some embodiments, a p1-th null stage and an m1-th stage of the second control signal driving circuit DC2 have a same circuit structure. The p1-th null stage is disconnected from subpixels in the display region DA. The m1-th stage is electrically connected to one or more subpixels in the display region DA. In some embodiments, a p2-th null stage and an m2-th stage of the third control signal driving circuit DC3 have a same circuit structure. The p2-th null stage is disconnected from subpixels in the display region DA. The m2-th stage is electrically connected to one or more subpixels in the display region DA.

In one example, M1=M2=M, P1=P2=P, a p-th null stage and an m-th stage of a respective control signal driving circuit have a same circuit structure. The p-th null stage is disconnected from subpixels in the display region DA. The m-th stage is electrically connected to one or more subpixels in the display region DA, for example, the m-th stage is configured to transmit a control signal to the one or more subpixels in the display region DA.

Referring to FIG. 1, FIG. 7A and FIG. 10, in some embodiments, in the third region R3, the N2 stages of the second control signal driving circuit DC2, the N1 stages of the first control signal driving circuit DC1, and the N3 stages of the third control signal driving circuit DC3 are sequentially arranged along the same direction from the third region toward the display region DA. In the second region R2, the M1 stages of the second control signal driving circuit DC2 and the M2 stages of the third control signal driving circuit DC3 are sequentially arranged along a same direction from the second region R2 toward the display region DA.

In one example, M1=M2=M, P1=P2=P, in the third region R3, n-th stages of the second control signal driving circuit DC2, the first control signal driving circuit DC1, and the third control signal driving circuit DC3 are sequentially arranged along the same direction from the third region R3 toward the display region DA. In the second region R2, the m-th stage of the second control signal driving circuit DC2 and the third control signal driving circuit DC3 are sequentially arranged along a same direction from the second region R2 toward the display region DA.

Figure 11:
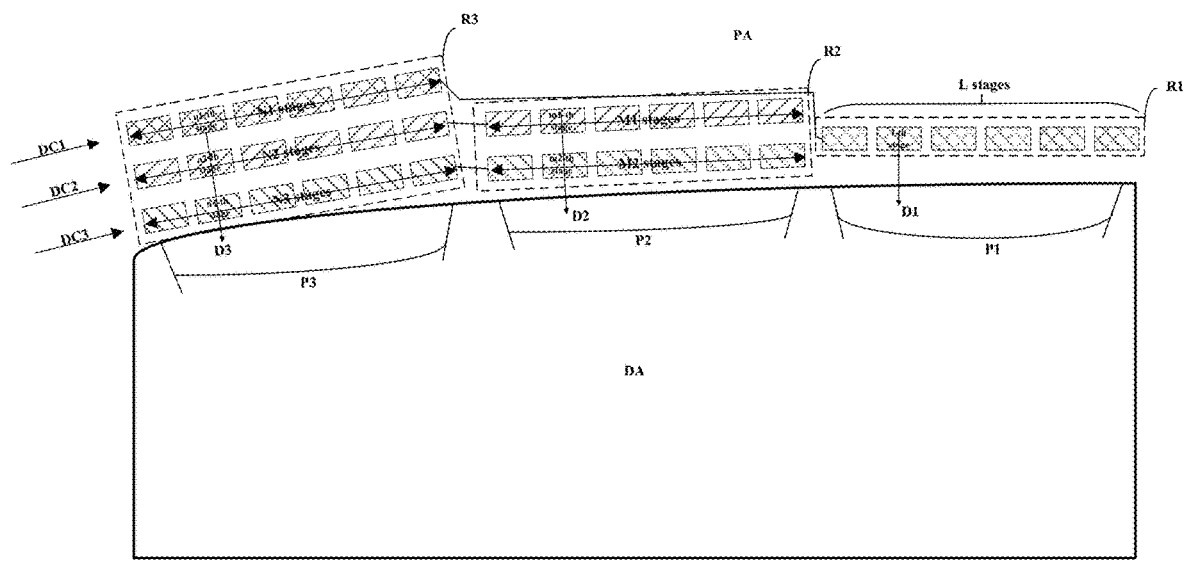
FIG. 11 is a schematic diagram illustrating a scan circuit in some embodiment according to the present disclosure.

FIG. 11 is a schematic diagram illustrating a scan circuit in some embodiment according to the present disclosure. Referring to FIG. 11, in some embodiments, in the third region R3, the N1 stages of the first control signal driving circuit DC1, the N2 stages of the second control signal driving circuit DC2, and the N3 stages of the third control signal driving circuit DC3 are sequentially arranged along the same direction from the third region R3 toward the display region DA. In the second region R2, the M1 stages of the second control signal driving circuit DC2 and the M2 stages of the third control signal driving circuit DC3 are sequentially arranged along a same direction from the second region R2 toward the display region DA.

In one example, M1=M2=M, P1=P2=P, in the third region R3, n-th stages of the first control signal driving circuit DC1, the second control signal driving circuit DC2, and the third control signal driving circuit DC3 are sequentially arranged along the same direction from the third region R3 toward the display region DA. In the second region R2, the m-th stage of the second control signal driving circuit DC2 and the third control signal driving circuit DC3 are sequentially arranged along a same direction from the second region R2 toward the display region DA.

Figure 12:
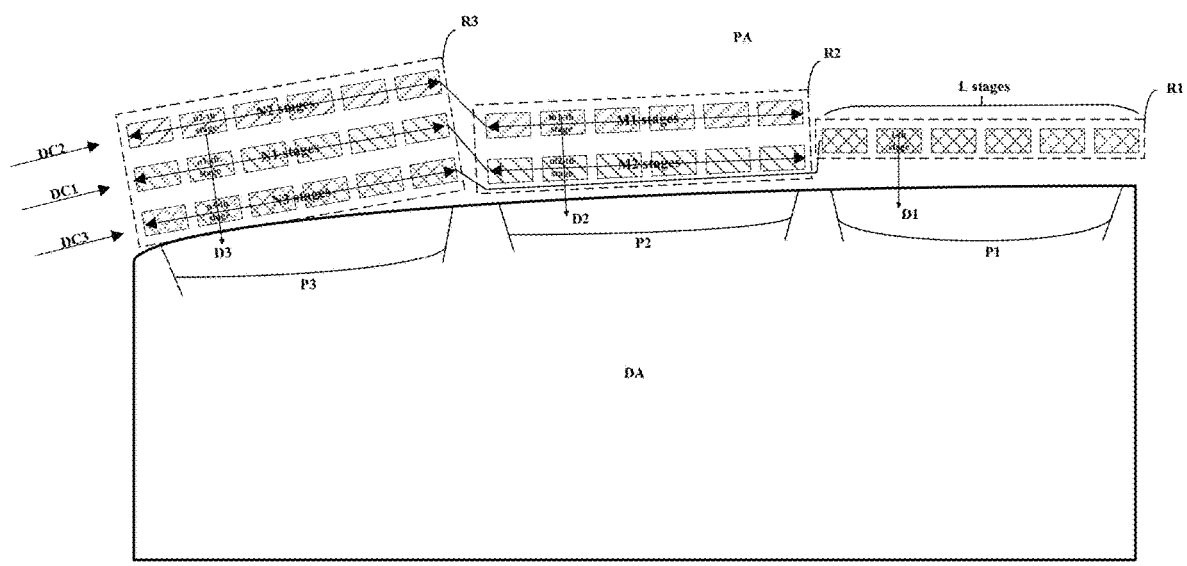
FIG. 12 is a schematic diagram illustrating a scan circuit in some embodiment according to the present disclosure.

FIG. 12 is a schematic diagram illustrating a scan circuit in some embodiment according to the present disclosure. Referring to FIG. 12, in some embodiments, in the third region R3, the N2 stages of the second control signal driving circuit DC2, the N3 stages of the third control signal driving circuit DC3, and the N1 stages of the first control signal driving circuit DC1 are sequentially arranged along the same direction from the third region R3 toward the display region DA. In the second region R2, the M1 stages of the second control signal driving circuit DC2 and the M2 stages of the third control signal driving circuit DC3 are sequentially arranged along a same direction from the second region R2 toward the display region DA.

In one example, M1=M2=M, P1=P2=P, in the third region R3, n-th stages of the second control signal driving circuit DC2, the third control signal driving circuit DC3, and the first control signal driving circuit DC1 are sequentially arranged along the same direction from the third region R3 toward the display region DA. In the second region R2, the m-th stage of the second control signal driving circuit DC2 and the third control signal driving circuit DC3 are sequentially arranged along a same direction from the second region R2 toward the display region DA.

In some embodiments, the first control signal driving circuit DC1, the second control signal driving circuit DC2, and the third control signal driving circuit DC3 are three different control signal driving circuits selected from a first gate scanning signal driving circuit, a light emission control signal driving circuit, and a second gate scanning signal driving circuit. In one example, the first control signal driving circuit DC1 is a first gate scanning signal driving circuit, the second control signal driving circuit DC2 is a light emission control signal driving circuit, and the third control signal driving circuit DC3 is a second gate scanning signal driving circuit.

Figure 13A:
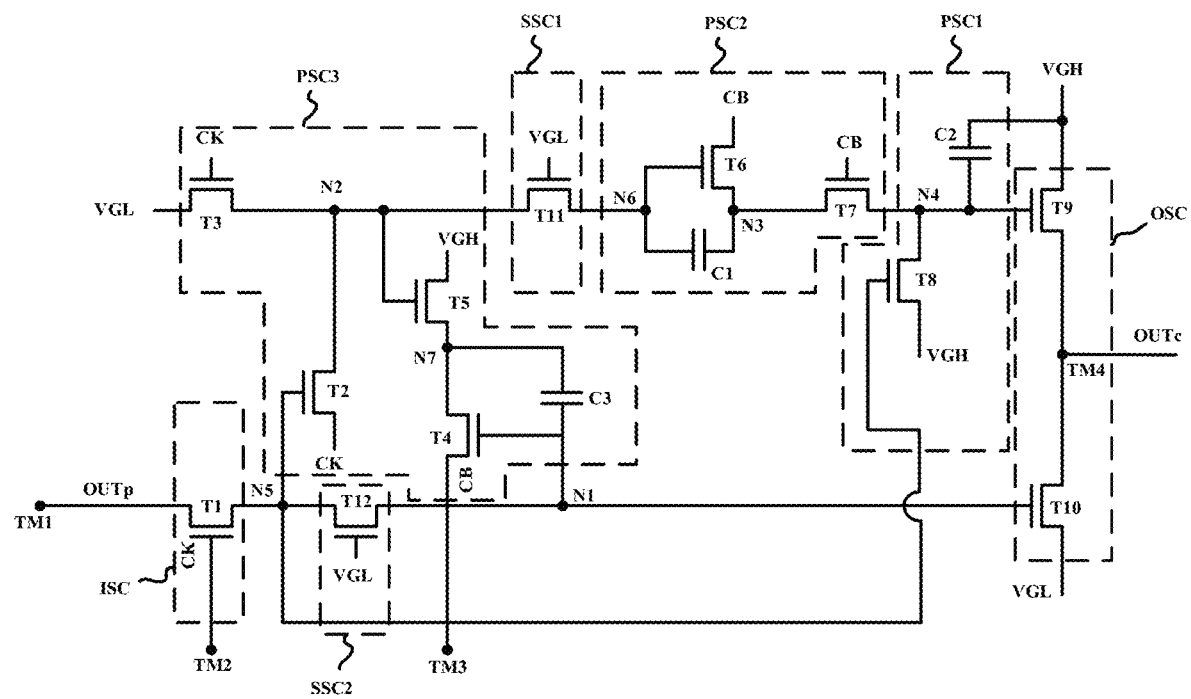
FIG. 13A is a circuit diagram of a respective stage of a respective control signal driving circuit in some embodiments according to the present disclosure.

FIG. 13A is a circuit diagram of a respective stage of a respective control signal driving circuit in some embodiments according to the present disclosure. Referring to FIG. 13A, the respective stage in some embodiments includes an input subcircuit ISC, an output subcircuit OSC, a first processing subcircuit PSC1, a second processing subcircuit PSC2, a third processing subcircuit PSC3, a first stabilizing subcircuit SSC1, and a second stabilizing subcircuit SSC2. A respective stage may be configured to transmit control signals to one or more rows of subpixels. In one example, the respective stage is configured to transmit control signals to a single row of subpixels. In another example, the respective stage is configured to transmit control signals to two or more rows of subpixels.

In some embodiments, the output subcircuit OSC is configured to supply the voltage of a first power supply VGH or a second power supply VGL to an output terminal TM4 in response to voltages of a fourth node N4 and a first node N1. Optionally, the output subcircuit OSC includes a ninth transistor T9 and a tenth transistor T10.

The ninth transistor T9 is coupled between a first power supply VGH and the output terminal TM4. A gate electrode of the ninth transistor T9 is coupled to the fourth node N4. The ninth transistor T9 may be turned on or off depending on the voltage of the fourth node N4. Optionally, when the ninth transistor T9 is turned on, the voltage of the first power supply VGH is provided to the output terminal TM4, which (annotated as Outc in FIG. 13A) may be transmitted to an n-th gate line and used as a gate driving signal having a gate-on level.

The tenth transistor T10 is coupled between the output terminal TM4 and a second power supply VGL. A gate electrode of the tenth transistor T10 is coupled to the first node N1. The tenth transistor T10 may be turned on or off depending on the voltage of the first node N1. Optionally, when the tenth transistor T10 is turned on, the voltage of the second power supply VGL is provided to the output terminal TM4, which (annotated as Outc in FIG. 13A) may be provided to an n-th gate line and used as a gate driving signal having a gate-off level. In one example, when the gate driving signal has a gate-off level, it may be understood that the gate driving signal is not provided.

In some embodiments, the input subcircuit ISC is configured to control the voltages of the first node N1 and a fifth node N5 in response to signals provided to the first input terminal TM1 and the second input terminal TM2, respectively. Optionally, the input subcircuit ISC includes a first transistor T1.

The first transistor T1 is coupled between the first input terminal TM1 and the fifth node N5. A gate electrode of the first transistor T1 is coupled to the second input terminal TM2. When the first clock signal CK is provided to the second input terminal TM2, the first transistor T1 is turned on to electrically couple the first input terminal TM1 with the fifth node N5.

In some embodiments, the first processing subcircuit PSC1 is configured to control the voltage of the fourth node N4 in response to the voltages of the first node N1 and the fifth node N5. Optionally, the first processing subcircuit PSC1 includes an eighth transistor T8 and a second capacitor C2.

The eighth transistor T8 is coupled between the first power supply VGH and the fourth node N4. A gate electrode of the eighth transistor T8 is coupled to the fifth node N5. The eighth transistor T8 may be turned on or off depending on the voltage of the fifth node N5. Optionally, when the eighth transistor T8 is turned on, the voltage of the first power supply VGH may be provided to the fourth node N4.

The second capacitor C2 is coupled between the first power supply VGH and the fourth node N4. Optionally, the second capacitor C2 is configured to charge a voltage to be applied to the fourth node N4. Optionally, the second capacitor C2 is configured to stably maintain the voltage of the fourth node N4.

In some embodiments, the second processing subcircuit PSC2 is coupled to a sixth node N6, and is configured to control the voltage of the fourth node N4 in response to a signal input to the third input terminal TM3. Optionally, the second processing subcircuit PSC2 includes a sixth transistor T6, a seventh transistor T7, and a first capacitor C1.

A first terminal of the first capacitor C1 is coupled to the sixth node N6, and a second terminal of the first capacitor C1 is coupled to a third node N3 that is a common node between the sixth transistor T6 and the seventh transistor T7.

The sixth transistor T6 is coupled between the third node N3 and the sixth node N6. A gate electrode of the sixth transistor T6 is coupled to the sixth node N6. The sixth transistor T6 may be turned on depending on the voltage of the sixth node N6 so that a voltage corresponding to the second clock signal CB provided to the third input terminal TM3 may be applied to the third node N3.

The seventh transistor T7 is coupled between the fourth node N4 and the third node N3. A gate electrode of the seventh transistor T7 is coupled to the third input terminal TM3. The seventh transistor T7 may be turned on in response to the second clock signal CB provided to the third input terminal TM3, and thus, applies the voltage of the first power supply VGH to the third node N3.

In some embodiments, the third processing subcircuit PSC3 is configured to control the voltage of the second node N2. Optionally, the third processing subcircuit PSC3 includes a second transistor T2, a third transistor T3, a fourth transistor T4, a fifth transistor T5, and a third capacitor C3.

A first electrode of the third capacitor C3 is coupled to the first node N1, and a second electrode of the third capacitor C3 is coupled to a seventh node N7 that is a common node between the fourth transistor T4 and the fifth transistor T5.

The fifth transistor T5 is coupled between the first power supply VGH and the seventh node N7. A gate electrode of the fifth transistor T5 is coupled to the second node N2. The fifth transistor T5 may be turned on or off depending on the voltage of the second node N2.

The fourth transistor T4 is coupled between the seventh node N7 and the third input terminal TM3. A gate electrode of the fourth transistor T4 is coupled to the first node N1. The fourth transistor T4 may be turned on or off depending on the voltage of the first node N1.

The second transistor T2 is coupled between the second node N2 and the second input terminal TM2. A gate electrode of the second transistor T2 is coupled to the fifth node N5.

The third transistor T3 is coupled between the second node N2 and the second power supply VGL. A gate electrode of the third transistor T3 is coupled to the second input terminal TM2. When the first clock signal CK is provided to the second input terminal TM2, the third transistor T3 may be turned on so that the voltage of the second power supply VGL may be provided to the second node N2.

In some embodiments, the first stabilizing subcircuit SSC1 is coupled between the second processing subcircuit PSC2 and the third processing subcircuit PSC3. Optionally, the first stabilizing subcircuit SSC1 is configured to limit a voltage drop width of the second node N2. Optionally, the first stabilizing subcircuit SSC1 includes an eleventh transistor T11.

The eleventh transistor T11 is coupled between the second node N2 and the sixth node N6. A gate electrode of the eleventh transistor T11 is coupled to the second power supply VGL. Since the second power supply VGL has a gate-on level voltage, the eleventh transistor T11 may always remain turned on. Therefore, the second node N2 and the sixth node N6 may be maintained at the same voltage, and operated as substantially the same node.

In some embodiments, the second stabilizing subcircuit SSC2 is coupled between the first node N1 and the fifth node N5. Optionally, the second stabilizing subcircuit SSC2 is configured to limit a voltage drop width of the first node N1. Optionally, the second stabilizing subcircuit SSC2 includes a twelfth transistor T12.

The twelfth transistor T12 is coupled between the first node N1 and the fifth node N5. A gate electrode of the twelfth transistor T12 is coupled to the second power supply VGL. Since the second power supply VGL has a gate-on level voltage, the twelfth transistor T12 may always remain turned on. Therefore, the first node N1 and the fifth node N5 may be maintained at the same voltage, and operated as substantially the same node.

In some embodiments, each of the first to twelfth transistors T1 to T12 may be formed of a p-type transistor. In some embodiments, the gate-on voltage of the first to twelfth transistors T1 to T12 may be set to a low level, and the gate-off voltage thereof may be set to a high level.

Figure 13B:
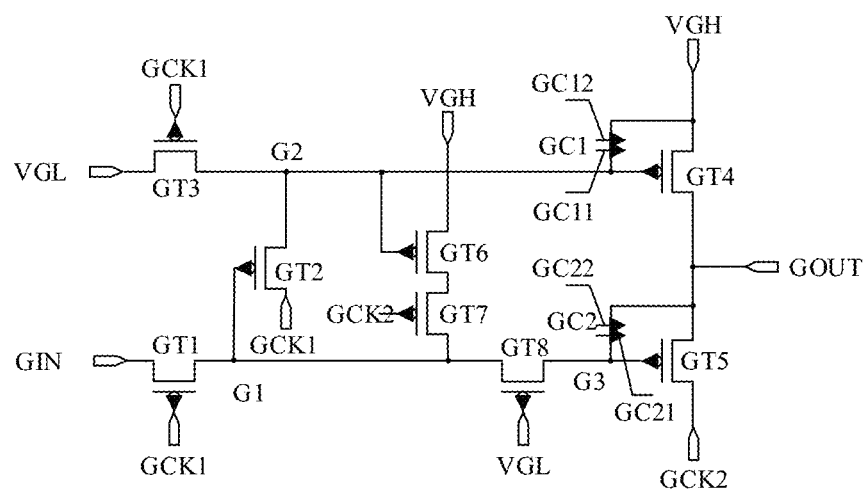
FIG. 13B is a circuit diagram of a respective stage of a respective control signal driving circuit in some embodiments according to the present disclosure.

FIG. 13B is a circuit diagram of a respective stage of a respective control signal driving circuit in some embodiments according to the present disclosure. Referring to FIG. 13B, the respective stage includes a first control transistor GT1 to an eighth control transistor GT8, a first control capacitor GC1 and a second control capacitor GC2. In some embodiments, a gate electrode of the first control transistor GT1 is electrically connected to a first clock signal terminal GCK1, a first electrode of the first control transistor GT1 is electrically connected to an input terminal GIN, a second electrode of the first control transistor GT1 is electrically connected to a first node G1; a gate electrode of the second control transistor GT2 is electrically connected to the first node G1, a first electrode of the second control transistor GT2 is electrically connected to the first clock signal terminal GCK1, the second electrode of the second control transistor GT2 is electrically connected to a second node G2; a gate electrode of the third control transistor GT3 is electrically connected to a first clock signal terminal GCK1, a first electrode of the third control transistor GT3 is electrically connected to a second power supply terminal VGL, a second electrode of the third control transistor GT3 is electrically connected to the second node G2; a gate electrode of the fourth control transistor GT4 is electrically connected to the second node G2, a first electrode of the fourth control transistor GT4 is electrically connected to a first power supply terminal VGH, a second electrode of the fourth control transistor GT4 is electrically connected to an output terminal GOUT; a gate electrode of the fifth control transistor GT5 is electrically connected to a third node G3, a first electrode of the fifth control transistor GT5 is electrically connected to a second clock signal terminal GCK2, a second electrode of the fifth control transistor GT5 is electrically connected to the output terminal GOUT; a gate electrode of the sixth control transistor GT6 is electrically connected to the second node G2, a first electrode of the sixth control transistor GT6 is electrically connected to the first power supply terminal VGH, a second electrode of the sixth control transistor GT6 is electrically connected to a first electrode of a seventh control transistor GT7; a gate electrode of the seventh control transistor GT7 is electrically connected to the second clock signal terminal GCK2, a second electrode of the seventh control transistor GT7 is electrically connected to the first node G1; a gate electrode of the eighth control transistor GT8 is electrically connected to a second power supply terminal VGL, a first electrode of the eighth control transistor GT8 is electrically connected to the first node G1, a second electrode of the eighth control transistor GT8 is electrically connected to a third node G3; a second electrode plate GC12 of a first control capacitor GC1 is electrically connected to the first power supply terminal VGH, a first electrode plate GC11 of the first control capacitor GC1 is electrically connected to the second node G2; and a second electrode plate GC22 of a second control capacitor GC2 is electrically connected to the output terminal GOUT, and a first electrode plate GC21 of the second control capacitor GC2 is electrically connected to the third node G3. In one example, the first control transistor GT1 to the eighth control transistor GT8 may be a P-type transistor or may be an N-type transistor. In another example, the first power supply terminal VGH provides a continuous high level signal and the second power supply terminal VGL provides a continuous low level signal.

In another aspect, the present invention provides a display apparatus, including the scan circuit described herein or fabricated by a method described herein, and a display panel having a plurality of pixel driving circuits and a plurality of light emitting elements driven by the plurality of pixel driving circuits. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus. Optionally, the display apparatus is a quantum dots display apparatus.

The scan circuit described in the present disclosure may be used for generating various appropriate control signals to subpixels in a display panel. In one example, the scan circuit described in the present disclosure is a light emitting control signal generating circuit configured to generate light emitting control signals for subpixels in a display panel. In another example, the scan circuit described in the present disclosure is a gate scanning signal generating circuit configured to generate gate scanning signals for subpixels in a display panel. In another example, the scan circuit described in the present disclosure is a reset control signal generating circuit configured to generate reset control signals for subpixels in a display panel.

Figure 16:
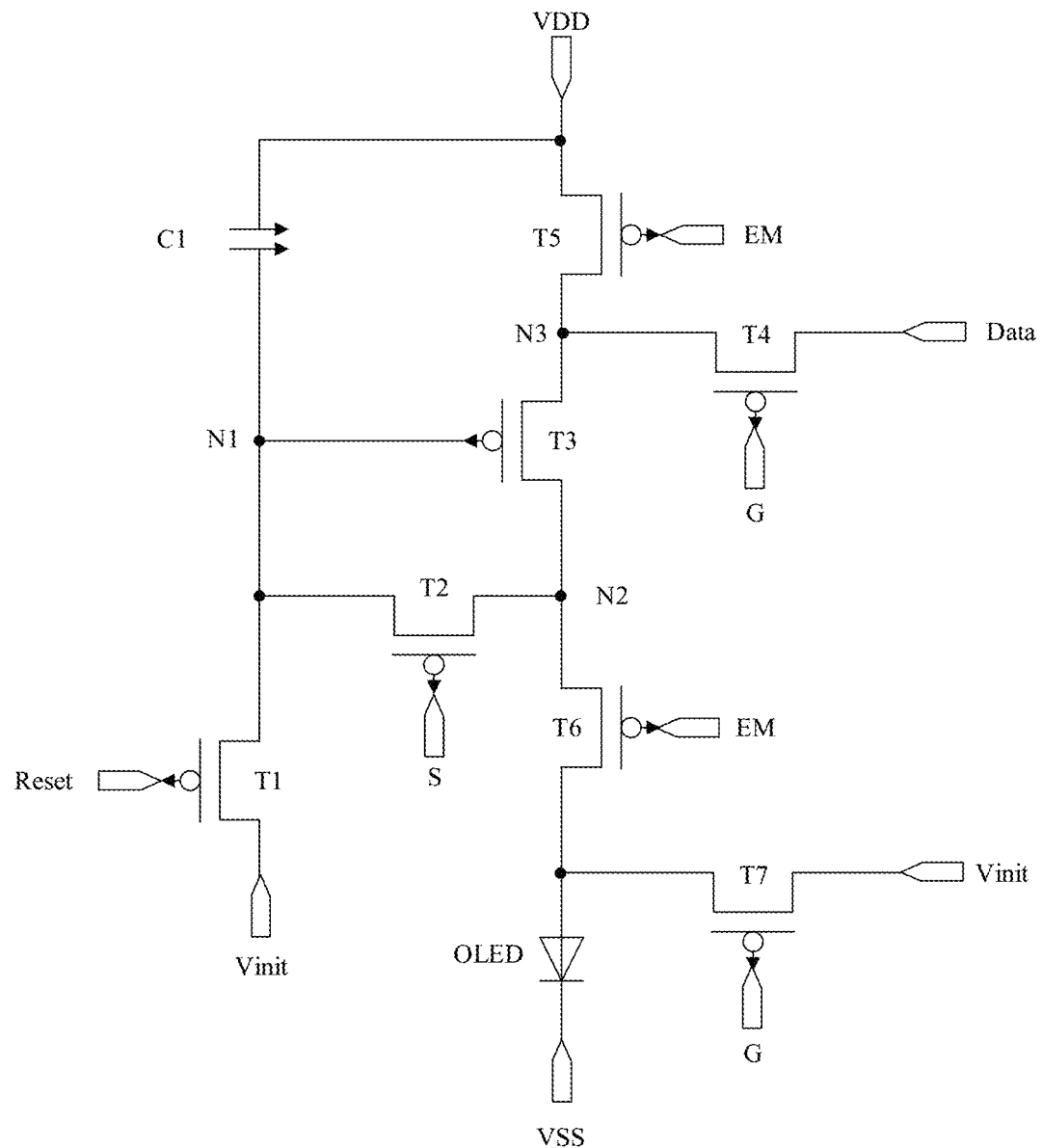
FIG. 16 is a circuit diagram illustrating the structure of a respective pixel driving circuit in a display apparatus in some embodiments according to the present disclosure.

In some embodiments, a respective pixel driving circuit of the plurality of pixel driving circuits includes N-type transistors (e.g., T1 and T2 in FIG. 16) and P-type transistors (e.g., T3 to T7 in FIG. 16). In some embodiments, the first control signal driving circuit is configured to transmit gate scanning signals to first N-type transistors in the plurality of pixel driving circuits and reset control signals to second N-type transistors in the plurality of pixel driving circuits; the second control signal driving circuit is configured to transmit light emission control signals to light emission control transistors (e.g., T5 and T6 in FIG. 16) in the plurality of pixel driving circuits; and the third control signal driving circuit is configured to transmit gate scanning signals to P-type transistors (e.g., T4 and T7 in FIG. 16) in the plurality of pixel driving circuits.

Figure 14:
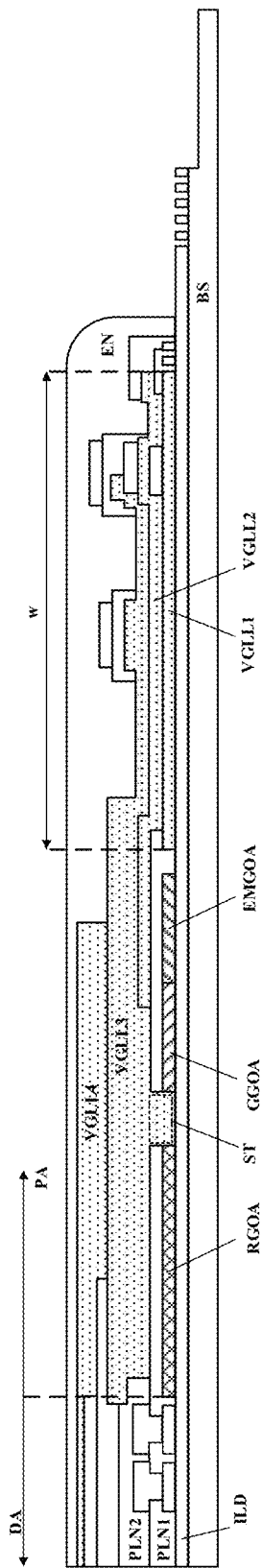
FIG. 14 is a schematic diagram illustrating the structure of a peripheral region of a display apparatus in some embodiments according to the present disclosure.

FIG. 14 is a schematic diagram illustrating the structure of a peripheral region of a display apparatus in some embodiments according to the present disclosure. Referring to FIG. 14, the display apparatus in the peripheral region includes a base substrate BS, an inter-layer dielectric layer ILD on the base substrate BS, a first planarization layer PLN1 on a side of the inter-layer dielectric layer ILD away from the base substrate BS, and a second planarization layer PLN2 on a side of the first planarization layer PLN1 away from the inter-layer dielectric layer ILD. The display apparatus includes a light emitting control signal generating circuit EMGOA, a gate scanning signal generating circuit GGOA, and a reset control signal generating circuit RGOA in the peripheral region. The gate scanning signal generating circuit GGOA and the reset control signal generating circuit RGOA are separate from each other. In some embodiments, the second voltage supply signal line includes four sublayers, including a first sub-layer VGLL1, a second sub-layer VGLL2 on the first sub-layer VGLL1, a third sub-layer VGLL3 on a side of the second sub-layer VGLL2 away from the first sub-layer VGLL1, and a fourth sub-layer VGLL4 on a side of the third sub-layer VGLL3 away from the second sub-layer VGLL2. In one example, the third sub-layer VGLL3 is in a same layer as an anode layer of light emitting diodes in the display apparatus. In another example, the fourth sub-layer VGLL4 is in a same layer as a cathode layer of light emitting diodes in the display apparatus. The display apparatus further includes an encapsulating layer EN on a side of the fourth sub-layer VGLL4 away from the base substrate BS, thereby encapsulating the display apparatus. As shown in FIG. 14, the first sub-layer VGLL1 has a width w along a direction from the display region DA to the peripheral region PA.

In some embodiments, the third sub-layer VGLL3 extends through a slot ST extending through at least the first planarization layer PLN1. A portion of the third sub-layer VGLL3 in the slot ST spaces apart the reset control signal generating circuit RGOA and the gate scanning signal generating circuit GGOA. The light emitting control signal generating circuit EMGOA is on a side of the gate scanning signal generating circuit GGOA away from the slot ST and the reset control signal generating circuit RGOA.

Figure 15A:
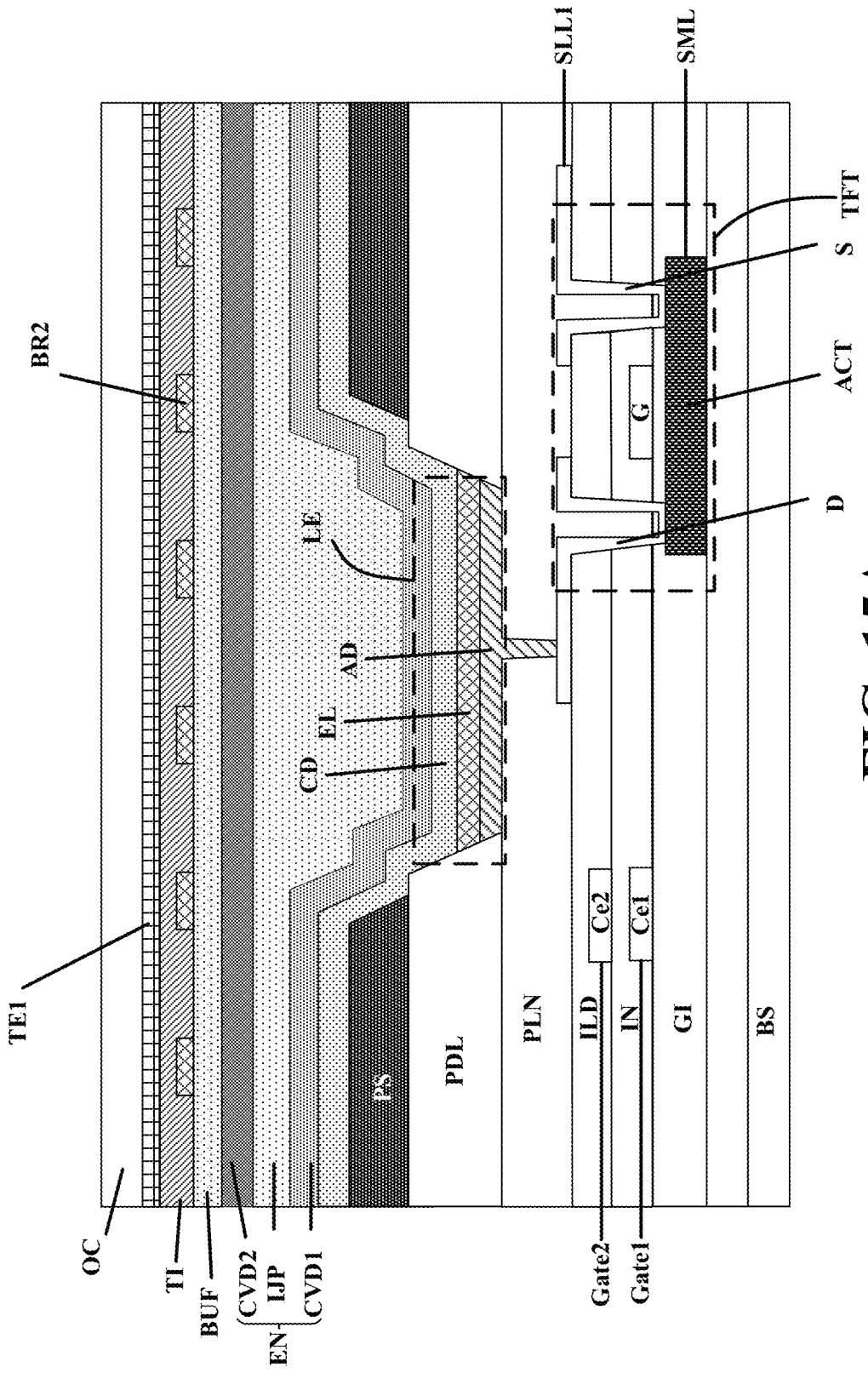
FIG. 15A illustrates a detailed structure in a display region in a display panel in some embodiments according to the present disclosure.

Various implementations of the present display panel may be practiced. FIG. 15A illustrates a detailed structure in a display region in a display panel in some embodiments according to the present disclosure. Referring to FIG. 15A, the display panel in the display region in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first conductive layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second conductive layer) on a side of the insulating layer IN away from the gate insulating layer GI; an inter-layer dielectric layer ILD on a side of the second capacitor electrode Ce2 away from the gate insulating layer GI; a first electrode S and a second electrode D (parts of a first SD metal layer) on a side of the inter-layer dielectric layer ILD away from the gate insulating layer GI; a planarization layer PLN on a side of the first electrode S and the second electrode D away from the inter-layer dielectric layer ILD; a pixel definition layer PDL defining a subpixel aperture and on a side of the planarization layer PLN away from the base substrate BS; and a light emitting element LE in the subpixel aperture. The light emitting element LE includes an anode AD on a side of the planarization layer PLN away from the inter-layer dielectric layer ILD; a light emitting layer EL on a side of the anode AD away from the planarization layer PLN; and a cathode layer CD on a side of the light emitting layer EL away from the anode AD. The display panel in the display region further includes an encapsulating layer EN encapsulating the light emitting element LE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer JP on a side of the first inorganic encapsulating sub-layer CVD1 away from the base substrate BS, and a second inorganic encapsulating sub-layer CVD2 on a side of the organic encapsulating sub-layer JP away from the first inorganic encapsulating sub-layer CVD1. The display panel in the display region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI.

Referring to FIG. 15A, the display panel includes a semiconductor material layer SML, a first conductive layer Gate1, a second conductive layer Gate2, and a first signal line layer SLL1. The display panel further includes an insulating layer IN between the first conductive layer Gate1 and the second conductive layer Gate2; and an inter-layer dielectric layer ILD between the second conductive layer Gate2 and the first signal line layer SLL1.

Figure 15B:
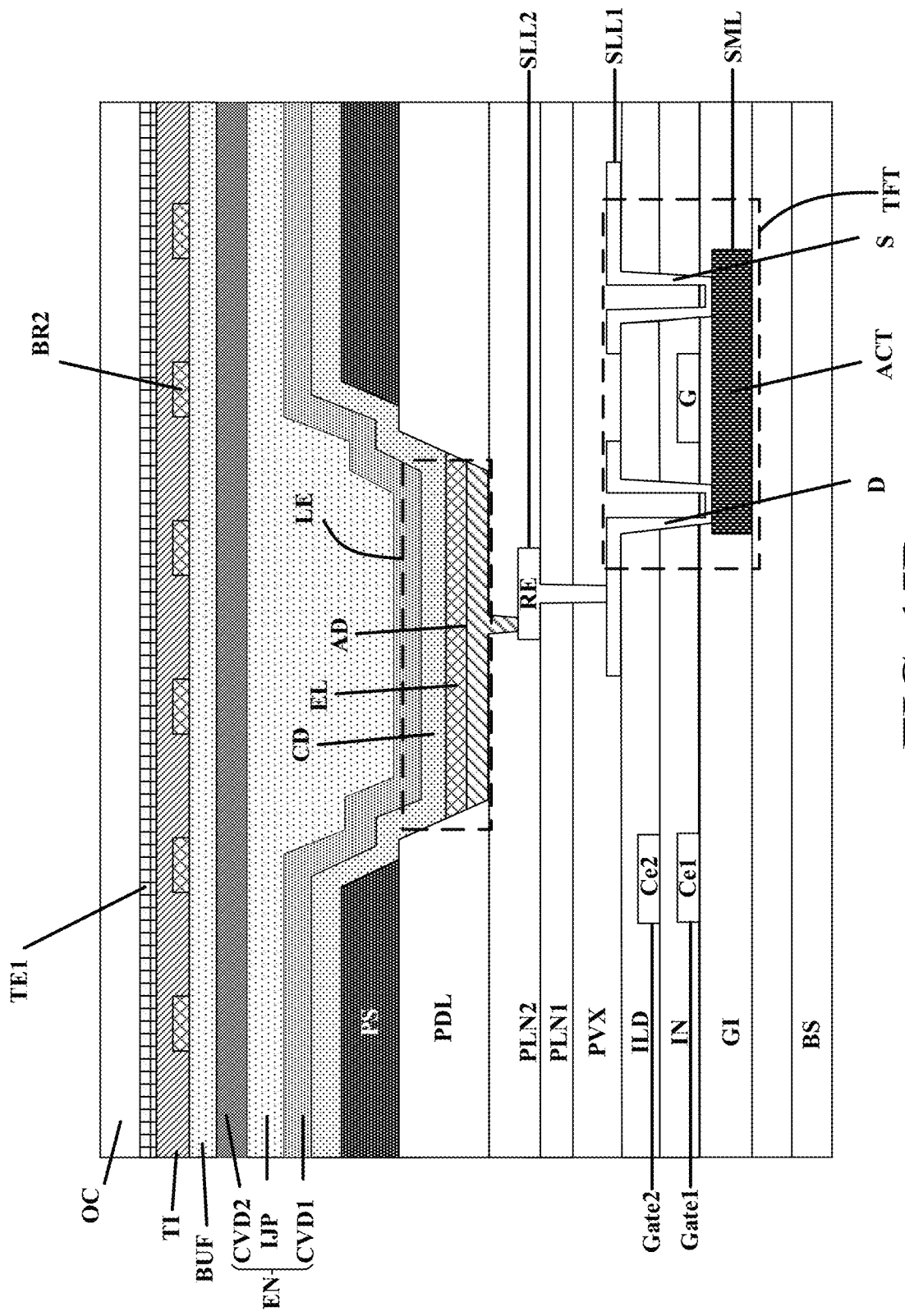
FIG. 15B illustrates a detailed structure in a display region in a display panel in some embodiments according to the present disclosure.

FIG. 15B illustrates a detailed structure in a display region in a display panel in some embodiments according to the present disclosure. Referring to FIG. 15B, the display panel in the display region in some embodiments includes a base substrate BS (e.g., a flexible base substrate); an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first conductive layer) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second conductive layer) on a side of the insulating layer IN away from the gate insulating layer GI; an inter-layer dielectric layer ILD on a side of the second capacitor electrode Ce2 away from the gate insulating layer GI; a first electrode S and a second electrode D (parts of a first SD metal layer) on a side of the inter-layer dielectric layer ILD away from the gate insulating layer GI; a passivation layer PVX on a side of the first electrode S and the second electrode D away from the inter-layer dielectric layer ILD; a first planarization layer PLN1 on a side of the passivation layer PVX away from the inter-layer dielectric layer ILD; a relay electrode RE (part of a second SD metal layer) on a side of the first planarization layer PLN1 away from the passivation layer PVX; a second planarization layer PLN2 on side of the relay electrode RE away from the first planarization layer PLN1; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The display panel in the display region further includes an encapsulating layer EN encapsulating the light emitting element LE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer JP away from the first inorganic encapsulating sub-layer CVD1. The display panel in the display region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI. Optionally, the display panel in the display region does not include the passivation layer PVX, e.g., the inter-layer dielectric layer ILD is in direct contact with the first planarization layer PLN1.

Referring to FIG. 15B, the display panel includes a semiconductor material layer SML, a first conductive layer Gate1, a second conductive layer Gate2, a first signal line layer SLL1, and a second signal line layer SLL2. The display panel further includes an insulating layer IN between the first conductive layer Gate1 and the second conductive layer Gate2; an inter-layer dielectric layer ILD between the second conductive layer Gate2 and the first signal line layer SLL1; and at least a passivation layer PVX or a planarization layer PLN between the first signal line layer SLL1 and the second signal line layer SLL2.

FIG. 16 is a circuit diagram illustrating the structure of a respective pixel driving circuit in a display apparatus in some embodiments according to the present disclosure. Referring to FIG. 16, in some embodiments, the respective pixel driving circuit includes seven transistors (first transistor T1 to seventh transistor T7), a capacitor C, and eight signal terminals including a data signal terminal Data, a control signal terminal G, a scan signal terminal S, a reset signal terminal Reset, a light emitting signal terminal EM, an initial signal terminal Vinit, a first power supply terminal VDD, and a second power supply terminal VSS.

In some embodiments, a first electrode plate of the capacitor C is connected to the first power supply terminal VDD and a second electrode plate of the capacitor C is connected to a first node N1. A gate electrode of the first transistor T1 is connected to the reset signal terminal Reset, a first electrode of the first transistor T1 is connected to the initial signal terminal Vinit, and a second electrode of the first transistor is connected to the first node N1; a gate electrode of the second transistor T2 is connected to the scan signal terminal S, a first electrode of the second transistor T2 is connected to the first node N1, and a second electrode of the second transistor T2 is connected to a second node N2; a gate electrode of the third transistor T3 is connected to the first node N1, a first electrode of the third transistor T3 is connected to the second node N2, and a second electrode of the third transistor T3 is connected to a third node N3; a gate electrode of the fourth transistor T4 is connected to the control signal terminal G, a first electrode of the fourth transistor T4 is connected to the data signal terminal Data, and a second electrode of the fourth transistor T4 is connected to the third node N3; a gate electrode of the fifth transistor T5 is connected to the light emitting signal terminal EM, a first electrode of the fifth transistor T5 is connected to the first power supply terminal VDD, a second electrode of the fifth transistor T5 is connected to the third node N3; a gate electrode of the sixth transistor T6 is connected to the light emitting signal terminal EM, a first electrode of the sixth transistor T6 is connected to the second node N2, a second electrode of the sixth transistor T6 is connected to an anode of a respective light emitting element driven by the respective pixel driving circuit; a gate electrode of the seventh transistor T7 is connected to the control signal terminal G, a first electrode of the seventh transistor T7 is connected to the initial signal terminal Vinit, a second electrode of the seventh transistor T7 is connected to the anode of the respective light emitting element, and a second electrode of the respective light emitting element is connected to the second power supply terminal VSS. In some embodiments, the first transistor T1 may be referred to as a reset transistor, and when a valid level signal is input at the reset signal terminal Reset, the first transistor T1 transmits an initialization voltage to the first node N1 to initialize the charge of the first node N1.

In some embodiments, the third transistor T3 may be referred to as a drive transistor and the third transistor T3 determines the drive current flowing between the first power supply terminal VDD and the second power supply terminal VSS based on the potential difference between the gate electrode and the first electrode of the third transistor T3.

In some embodiments, the fourth transistor T4 may be referred to as a write transistor, etc., and when a valid level signal is input at the control signal terminal S1, the fourth transistor T4 causes the data voltage at the data signal terminal Data to be input to the pixel drive circuit.

In some embodiments, the fifth transistor T5 and the sixth transistor T6 may be referred to as light-emitting transistors. When a valid level signal is input at the light emitting signal terminal EM, the fifth transistor T5 and the sixth transistor T6 cause the respective light emitting element to emit light by forming a drive current path between the first power supply terminal VDD and the second power supply terminal VSS.

In some embodiments, the signal at the first power supply terminal VDD is a continuously provided high level signal and the signal at the second power supply terminal VSS is a low level signal.

In some embodiments, the first transistor T1 and the second transistor T2 are metal oxide transistors and are N-type transistors, and the third transistor T3 to the seventh transistor T7 are low temperature polycrystalline silicon transistors and are P-type transistors.

In some embodiments, the first transistor T1 and the second transistor T2, being oxide transistors, can reduce leakage current and improve the performance of the respective pixel driving circuit, which can reduce the power consumption of the respective pixel driving circuit.

In some embodiments, the first power supply terminal VDD is configured to continuously provide a high level signal and the second power supply terminal VSS is configured to continuously provide a low level signal.

Figure 17:
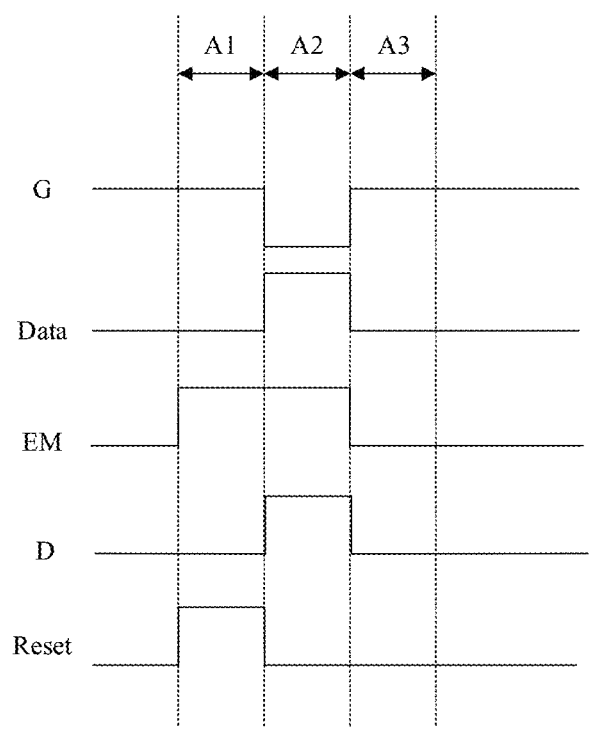
FIG. 17 is a timing diagram of operating a display apparatus in some embodiments according to the present disclosure.

FIG. 17 is a timing diagram of operating a display apparatus in some embodiments according to the present disclosure. Referring to FIG. 16 and FIG. 17, in some embodiments, the operating process of the pixel drive circuit may comprise a first phase A1, a second phase A2, and a third phase A3.

In a first phase A1, e.g., a reset phase, signals of the reset signal terminal Reset, the control signal terminal G, and the light emitting signal terminal EM are all high level signals; and signal of the scan signal terminal S is a low level signal. The signal of the reset signal terminal Reset is a high level signal, the first transistor T1 is turned on, the signal of the initial signal terminal Vinit is supplied to the first node N1, the capacitor C is initialized and the original data voltage in the capacitor C is cleared. The signals of the control signal terminal G and the light emitting signal terminal EM are high level signals, the signal of the scanning signal terminal S is a low level signal, the second transistor T2, the fourth transistor T4, the fifth transistor T5, the sixth transistor T6 and the seventh transistor T7 are turned off, and the OLED does not emit light at this stage.

In the second phase A2, e.g., a data writing phase or the threshold compensation phase, signals at the control signal terminal G and the reset signal terminal Reset are low level signals, signals at the light emitting signal terminal EM and the scan signal terminal S are high level signals, and the data signal terminal Data outputs a data voltage. At this stage, the third transistor T3 is turned on because the voltage level at the first node N1 is low. The signal at the control signal terminal G is a low level signal, the fourth transistor T4 and the seventh transistor T7 are turned on. The signal at the scan signal terminal S is a high level signal, and the second transistor T2 is turned on. The second transistor T2 and the fourth transistor T4 are turned on so that the data voltage output from the data signal terminal Data is provided to the first node N1 via the third node N3, the conducting third transistor T3, the second node N2, and the conducting second transistor T2. The difference between the data voltage output from the data signal terminal Data and the threshold voltage of the third transistor T3 is charged to the capacitor C until the voltage at the first node N1 is Vd−|Vth|, Vd being the data voltage output by Data at the data signal terminal and Vth being the threshold voltage of the third transistor T3. The seventh transistor T7 is turned on so that the initial voltage of the initial signal terminal Vinit is supplied to the anode of the OLED, resetting the anode of the OLED, clears its internal pre-stored voltage, completes the initialization, and ensures that the OLED does not emit light. The signal of the reset signal terminal Reset is a low level signal, and the first transistor T1 is turned off. The signal of the light emitting signal terminal EM is a high level signal, and the fifth transistor T5 and the sixth transistor T6 are turned off.

In the third phase A3, e.g., the light-emitting phase, the signals of the control signal terminal G, the scanning signal terminal S, the light emitting signal terminal EM, and the reset signal terminal Reset are all low-level signals. The signal of the light emitting signal terminal EM is a low-level signal, the fifth transistor T5 and the sixth transistor T6 are turned on, and the supply voltage output from the first power supply terminal VDD provides a drive voltage to the anode of the OLED via the on fifth transistor T5, the third transistor T3, and the sixth transistor T6 to drive the OLED to emit light.

The drive current flowing through the third transistor T3 (driving transistor) during the driving process of the respective pixel driving circuit is determined by the voltage difference between the gate electrode and the first electrode of the third transistor T3. As the voltage at the first node N1 is Vd−|Vth|, the drive current of the third transistor T3 can be expressed as:

$$I=K^*(Vgs-Vth)^2=K^*[(Vdd-Vd+|Vth|)-Vth]^2=K^*[(Vdd-Vd]^2$$

wherein I is the drive current flowing through the third transistor T3, i.e. the drive current for driving the OLED, K is a constant, Vgs is the voltage difference between the gate electrode and the first electrode of the third transistor T3, Vth is the threshold voltage of the third transistor T3, Vd is the data voltage output from the data signal terminal Data, and Vdd is the supply voltage output from the first supply terminal VDD.

Figure 18:
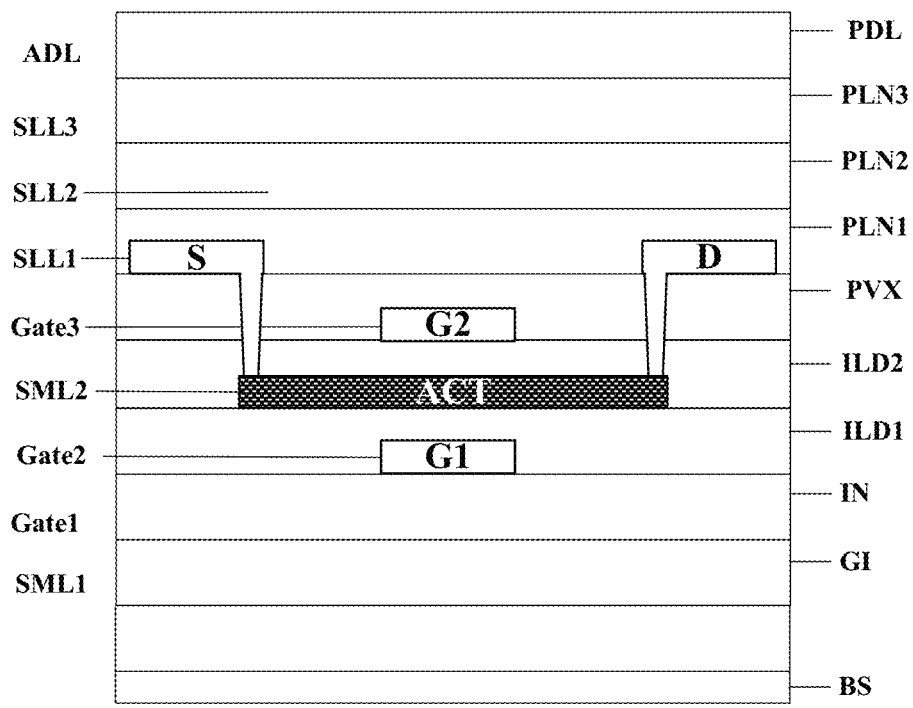
FIG. 18 illustrates a detailed structure of an N-type transistor in a display panel in some embodiments according to the present disclosure.

In some embodiments, the respective pixel driving circuit includes one or more N-type transistors. FIG. 18 illustrates a detailed structure of an N-type transistor in a display panel in some embodiments according to the present disclosure. Referring to FIG. 18, the display panel in some embodiments includes a base substrate BS, a first semiconductor material layer SML1 on the base substrate BS, a gate insulating layer GI on a side of the first semiconductor material layer SML1 away from the base substrate BS, a first conductive layer Gate1 on a side of the gate insulating layer GI away from the base substrate BS, an insulating layer IN on a side of the first conductive layer Gate1 away from the base substrate BS, a second conductive layer Gate2 on a side of the insulating layer IN away from the base substrate BS, a first inter-layer dielectric layer ILD1 on a side of the second conductive layer Gate2 away from the base substrate BS, a second semiconductor material layer SML2 on a side of the first inter-layer dielectric layer ILD1 away from the base substrate BS, a second inter-layer dielectric layer ILD2 on a side of the second semiconductor material layer SML2 away from the base substrate BS, a third conductive layer Gate3 on a side of the second inter-layer dielectric layer ILD2 away from the base substrate BS, a passivation layer PVX on a side of the third conductive layer Gate3 away from the base substrate BS, a first signal line layer SLL1 on a side of the passivation layer PVX away from the base substrate BS, a first planarization layer PLN1 on a side of the first signal line layer SLL1 away from the base substrate BS, a second signal line layer SLL2 on a side of the first planarization layer PLN1 away from the base substrate BS, a second planarization layer PLN2 on a side of the second signal line layer SLL2 away from the base substrate BS, a third signal line layer SLL3 on a side of the second planarization layer PLN2 away from the base substrate BS, a third planarization layer PLN3 on a side of the third signal line layer SLL3 away from the base substrate BS, an anode layer ADL on a side of the third planarization layer PLN3 away from the base substrate BS, and a pixel definition layer PDL on a side of the anode layer ADL away from the base substrate BS.

In some embodiments, the N-type transistor (e.g., the first transistor T1 or the second transistor T2 in FIG. 16) includes a double-gate structure comprising a first gate electrode G1 in the second conductive layer Gate2 and a second gate electrode G2 in the third conductive layer Gate3. The N-type transistor further includes an active layer ACT in the second semiconductor material layer SML2, a source electrode S and a drain electrode D in the first signal line layer SLL1. Optionally, the active layer ACT in the second semiconductor material layer SML2 is made of a metal oxide material.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A scan circuit, comprising a first control signal driving circuit, a second control signal driving circuit, and a third control signal driving circuit;
    wherein, in a first region, the first control signal driving circuit comprises L stages, L being an integer ≥1;
    in a second region, the second control signal driving circuit comprises M1 stages and the third control signal driving circuit comprises M2 stages, M1 being an integer ≥1, M2 being an integer ≥1;
    in a third region, the first control signal driving circuit comprises N1 stages, the second control signal driving circuit comprises N2 stages, and the third control signal driving circuit comprises N3 stages, N1 being an integer ≥2, N2 being an integer ≥2, N3 being an integer ≥2; and
    the first region, the second region, and the third region surround a first portion, a second portion, and a third portion of a perimeter of a display region, respectively, the first portion, the second portion, and the third portion being at least partially non-overlapping.

2. The scan circuit of claim 1, wherein the first portion, the second portion, and the third portion are completely non-overlapping.

3. The scan circuit of claim 1, wherein a stage of the M1 stages and a stage of the N2 stages are two consecutive stages of the second control signal driving circuit;
    a stage of the M2 stages and a stage of the N3 stages are two consecutive stages of the third control signal driving circuit; and
    a stage of L stages and a stage of N1 stages are two consecutive stages of the first control signal driving circuit.

4. The scan circuit of claim 1, wherein the N2 stages of the second control signal driving circuit, the N1 stages of the first control signal driving circuit, and the N3 stages of the third control signal driving circuit are arranged along a same direction; and
    the L stages of the first control signal driving circuit is displaced from the M1 stages of the second control signal driving circuit and the M2 stages of the third control signal driving circuit which are arranged along a same direction.

5. The scan circuit of claim 1, wherein the N2 stages of the second control signal driving circuit, the N1 stages of the first control signal driving circuit, and the N3 stages of the third control signal driving circuit are arranged in three rows in the third region, each row surrounding the third portion;
    the M1 stages of the second control signal driving circuit and the M2 stages of the third control signal driving circuit are arranged in two rows in the second region, each row surrounding the second portion; and
    the L stages of the first control signal driving circuit are arranged in one row surrounding the first portion.

6. The scan circuit of claim 5, further comprising one or more signal lines connecting the L stages of the first control signal driving circuits in the first region and the N1 stages of the first control signal driving circuits in the third region; and
    at least one of the one or more signal lines surrounds the second portion, and extends through the second region.

7. The scan circuit of claim 6, wherein at least one of the one or more signal lines is between a first row of the M1 stages of the second control signal driving circuit and a second row of the M2 stages of the third control signal driving circuit.

8. The scan circuit of claim 6, wherein the one or more signal lines comprise an input signal line of a first stage of the N1 stages of the first control signal driving circuit, extending through the second region and connected to an output terminal of a last stage of the L stages of the first control signal driving circuit.

9. The scan circuit of claim 6, wherein the one or more signal lines comprise at least one signal line having a first segment and a second segment coupled to each other;
    the first segment at least partially extends in the first region;
    the second segment at least partially extends in the second region;
    the first segment is in a second conductive layer; and
    the second segment is in a first signal line layer different from the second conductive layer.

10. The scan circuit of claim 9, wherein the first segment in the first region is adjacent to L number of output signal lines configured to transmit output signals from the L stages of the first control signal driving circuit in the first region, respectively;

the first segment and segments of the L number of output signal lines in the first region are between the L stages of the first control signal driving circuit and the display region; and the L number of output signal lines is in a third conductive layer different from the first signal line layer and the second conductive layer.

11. The scan circuit of claim 1, further comprising L number of output signal lines connected to the L stages of the first control signal driving circuit in the first region, respectively;

the L number of output signal lines extend from the first region into the second region by different length; and the L number of output signal lines are coupled to (j*L) number of rows of subpixels, respectively, j being an integer ≥1.

12. The scan circuit of claim 11, wherein, in the second region, the M1 stages of the second control signal driving circuit are on a side of the M2 stages of the third control signal driving circuit away from the display region; and segments of the L number of output signal lines in the second region are on a side of the M2 stages of the third control signal driving circuit closer to the display region.

13. The scan circuit of claim 1, wherein the M1 stages and P1 null stages of the second control signal driving circuit are arranged in a first row and (M1+P1) columns in the second region, the first row surrounding the second portion; and the M2 stages and P2 null stages of the third control signal driving circuit are arranged in a second row and (M2+P2) columns in the second region, the second row surrounding the second portion.

14. The scan circuit of claim 13, wherein a p1-th null stage and an m1-th stage of the second control signal driving circuit have a same circuit structure;

the p1-th null stage is disconnected from subpixels in the display region;

the m1-th stage is electrically connected to one or more subpixels in the display region;

a p2-th null stage and an m2-th stage of the third control signal driving circuit have a same circuit structure;

the p2-th null stage is disconnected from subpixels in the display region; and the m2-th stage is electrically connected to one or more subpixels in the display region.

15. The scan circuit of claim 1, wherein, in the third region, the N2 stages of the second control signal driving circuit, the N1 stages of the first control signal driving circuit, and the N3 stages of the third control signal driving circuit are sequentially arranged along the same direction from the third region toward the display region; and in the second region, the M1 stages of the second control signal driving circuit and the M2 stages of the third control signal driving circuit are sequentially arranged along a same direction from the second region toward the display region.

16. The scan circuit of claim 1, wherein, in the third region, the N1 stages of the first control signal driving circuit, the N2 stages of the second control signal driving circuit, and the N3 stages of the third control signal driving circuit are sequentially arranged along the same direction from the third region toward the display region; and in the second region, the M1 stages of the second control signal driving circuit and the M2 stages of the third control signal driving circuit are sequentially arranged along a same direction from the second region toward the display region.

17. The scan circuit of claim 1, wherein, in the third region, the N2 stages of the second control signal driving circuit, the N3 stages of the third control signal driving circuit, and the N1 stages of the first control signal driving circuit are sequentially arranged along the same direction from the third region toward the display region; and in the second region, the M1 stages of the second control signal driving circuit and the M2 stages of the third control signal driving circuit are sequentially arranged along a same direction from the second region toward the display region.

18. The scan circuit of claim 1, wherein the first control signal driving circuit, the second control signal driving circuit, and the third control signal driving circuit are three different control signal driving circuits selected from a first gate scanning signal driving circuit, a light emission control signal driving circuit, and a second gate scanning signal driving circuit.

19. A display apparatus, comprising the scan circuit of claim 1, and a display panel comprising a plurality of pixel driving circuits and a plurality of light emitting elements driven by the plurality of pixel driving circuits;

wherein the scan circuit is configured to transmit control signals to the plurality of pixel driving circuits;

the first control signal driving circuit is configured to transmit gate scanning signals to first N-type transistors in the plurality of pixel driving circuits and reset control signals to second N-type transistors in the plurality of pixel driving circuits;

the second control signal driving circuit is configured to transmit light emission control signals to light emission control transistors in the plurality of pixel driving circuits; and the third control signal driving circuit is configured to transmit gate scanning signals to P-type transistors in the plurality of pixel driving circuits.

20. The display apparatus of claim 19, wherein at least the second region is at a corner of the display apparatus.

* * * * *